US008205801B2

(12) United States Patent
Kobayashi et al.

(10) Patent No.: US 8,205,801 B2

(45) Date of Patent: Jun. 26, 2012

(54) SEMICONDUCTOR DEVICE HAVING WIRELESS COMMUNICATION FUNCTION

(75) Inventors: Hidetomo Kobayashi, Kanagawa (JP); Tomoaki Atsumi, Kanagawa (JP); Seiichi Yoneda, Kanagawa (JP); Yasuyuki Takahashi, Kanagawa (JP); Kiyoshi Kato, Kanagawa (JP)

(73) Assignee: Semiconductor Energy Laboratory Co., Ltd., Atsugi-shi, Kanaga-ken (JP)

( * ) Notice: Subject to any disclaimer, the term of this patent is extended or adjusted under 35 U.S.C. 154(b) by 0 days.

(21) Appl. No.: 12/894,719

(22) Filed: Sep. 30, 2010

(65) Prior Publication Data

US 2011/0079650 A1 Apr. 7, 2011

(30) Foreign Application Priority Data

Oct. 6, 2009 (JP) ................................ 2009-232085

(51) Int. Cl.
*G06K 19/06* (2006.01)

(52) U.S. Cl. ........ 235/492; 235/375; 235/451; 235/487; 235/493

(58) Field of Classification Search .................. 235/451, 235/487, 492, 375, 493
See application file for complete search history.

(56) References Cited

U.S. PATENT DOCUMENTS

| | | | | |
|---|---|---|---|---|
| 6,434,079 | B2 * | 8/2002 | Kim | 365/230.02 |
| 6,731,535 | B1 * | 5/2004 | Ooishi et al. | 365/171 |
| 7,259,740 | B2 | 8/2007 | Haga et al. | |
| 7,472,296 | B2 | 12/2008 | Kato et al. | |
| 2002/0161981 | A1 * | 10/2002 | Tsuchida et al. | 711/169 |
| 2003/0048680 | A1 * | 3/2003 | Ooishi et al. | 365/201 |
| 2005/0135181 | A1 * | 6/2005 | Shionoiri et al. | 365/230.06 |
| 2005/0210302 | A1 * | 9/2005 | Kato et al. | 713/320 |
| 2005/0220089 | A1 * | 10/2005 | Kawashima | 370/366 |
| 2006/0217917 | A1 * | 9/2006 | Abe | 702/119 |
| 2007/0123189 | A1 * | 5/2007 | Saito et al. | 455/333 |

FOREIGN PATENT DOCUMENTS

| | | | |
|---|---|---|---|
| JP | 62266794 | A | 11/1987 |
| JP | 2007-124433 | A | 5/2007 |
| JP | 2008-168985 | A | 7/2008 |

* cited by examiner

*Primary Examiner* — Ali Sharifzada

(74) *Attorney, Agent, or Firm* — Fish & Richardson P.C.

(57) ABSTRACT

A semiconductor device includes a memory portion, a logic portion, and a plurality of signal lines for electrically connecting the memory portion and the logic portion. In the case where a transfer rate between the semiconductor device and a communication device is $\alpha$ [bps], a first clock frequency generated in the logic portion is $K\alpha$ [Hz] (K is an integer of 1 or more), the number of reading signal lines of the plurality of signal lines is n (n is an integer of 2 or more), and a second clock frequency generated in the logic portion is $L\alpha/n$ [Hz] (L is any integer satisfying $L/n<K$), data stored in the memory portion is read to the logic portion through the n reading signal lines with use of the second clock frequency $L\alpha/n$ [Hz].

14 Claims, 10 Drawing Sheets data stored in a memory cell 1 0 1 0

CLK data read from a memory cell 1 0 1 0

100
101
110
111
120
190
200
171
173
175
177
181
183
185

200
490
170
125
480
130
140
160
432
434
110
100
ADDR
CP_CLK
WEB,REB
DATA

SEMICONDUCTOR DEVICE HAVING WIRELESS COMMUNICATION FUNCTION

BACKGROUND OF THE INVENTION

1. Field of the Invention

The present invention relates to a semiconductor device having a wireless communication function, and particularly relates to a semiconductor device including a memory. The present invention also relates to a semiconductor device which transmits and receives data in a non-contact manner.

2. Description of the Related Art

In recent years, an individual information identification technology called RFID (radio frequency identification) has attracted attention. In particular, an individual information identification technology using a semiconductor device which transmits and receives data in a non-contact manner by wireless communication (also called an RFID tag, an IC tag, an IC chip, an RF tag, a wireless tag, or an electronic tag), has been actively developed.

The individual information identification technology which employs RFID tags is beginning to be made use of in production management, distribution management, and the like, and it is expected that this technology will also be applied to personal authentication. For example, Patent Document 1 discloses an application example of RFID for identification and inspection of baggage.

Patent Document 2 discloses an example of baggage management using a set value stored in a memory portion of an RFID tag.

REFERENCE

Patent Documents

[Patent Document 1] Japanese Published Patent Application No. 2008-168985

[Patent Document 2] Japanese Published Patent Application No. 2007-124433

SUMMARY OF THE INVENTION

Electric power necessary for operating an RFID tag can be obtained by utilizing electromagnetic waves generated from a communication device such as a reader or a reader/writer. Also, an RFID tag may be operated with a battery incorporated therein.

Patent Document 1 discloses that an RFID tag receives an electromagnetic wave output from a reader/writer to generate power, whereby an IC chip starts operating so as to communicate with the reader/writer.

In general, an electromagnetic wave is attenuated with an increase in the distance from a generator of an electromagnetic wave (e.g., a communication device such as a reader/writer). Therefore, as the communication distance between an RFID tag and a reader/writer increases, less electromagnetic wave is available for the RFID tag and less power is received by the RFID tag.

RFID tags cannot transmit and receive data without receiving power for operating the RFID tags (power equal to or higher than the minimum operating power). For various applications or reliable data communication, RFID tags need to consume less power so that the minimum operating power can be reduced to facilitate operation.

In addition, the communication distance between an RFID tag and a communication device (such as a reader or a reader/writer) preferably has a certain degree of flexibility considering convenience. Therefore, RFID tags need to consume less power so that the minimum operating power can be reduced and the communication distance can be increased.

In the case where a battery is incorporated in RFID tags, the power consumption of the RFID tags is preferably reduced considering the battery life and the like.

As a method for reducing the power consumption of an RFID tag, all the data can be transmitted in parallel in the internal processing of the RFID tag so as to lower the clock frequency. However, in the case of an RFID tag having a memory such as a write-once memory element which consumes much power to write data, it is difficult to write data in parallel because the power consumption of the memory is increased and stable operation of the RFID tag cannot be secured.

The stable operation of RFID tags is important for use of the RFID tags in various management systems such as production or distribution management systems.

In view of the foregoing, an object of one embodiment of the present invention is to reduce the power consumption of a semiconductor device. Another object of one embodiment of the present invention is to increase the communication distance between a semiconductor device and a communication device. Still another object of one embodiment of the present invention is to keep stable operation of a semiconductor device. A further object of one embodiment of the present invention is to keep stable operation of a semiconductor device while reducing the power consumption of the semiconductor device.

One embodiment of the present invention is a semiconductor device including a memory portion, in which data is processed using a plurality of transmission methods. Specifically, data is written to and read from a memory portion by different transmission methods: data is written to the memory portion in serial and data is read from the memory portion in parallel. By writing data in serial, stable operation of the semiconductor device is secured. By reading data in parallel, the clock frequency is lowered to reduce power consumption.

One embodiment of the present invention is a semiconductor device having a wireless communication function, which includes a memory portion, a logic portion, and a plurality of signal lines for electrically connecting the memory portion and the logic portion. In the case where a transfer rate between the semiconductor device and a communication device is $\alpha$ [bps], a first clock frequency is $K\alpha$ [Hz] ($K$ is an integer of 1 or more), the number of reading signal lines of the plurality of signal lines is $n$ ($n$ is an integer of 2 or more), and a second clock frequency is $L\alpha/n$ [Hz] ($L$ is any integer satisfying $L/n<K$), a demodulated signal is decoded with use of the first clock frequency $K\alpha$ [Hz], and data stored in the memory portion is read to the logic portion through the n reading signal lines with use of the second clock frequency $L\alpha/n$ [Hz].

One embodiment of the present invention is a semiconductor device having a wireless communication function, which includes a memory portion, a logic portion, and a plurality of signal lines for electrically connecting the memory portion and the logic portion. In the case where a transfer rate between the semiconductor device and a communication device is $\alpha$ [bps], a first clock frequency is $K\alpha$ [Hz] ($K$ is an integer of 1 or more), the number of reading signal lines of the plurality of signal lines is $n$ ($n$ is an integer of 2 or more), and a second clock frequency is $L\alpha/n$ [Hz] ($L$ is any integer satisfying $L/n<K$), a demodulated signal is decoded with use of the first clock frequency $K\alpha$ [Hz], data stored in the memory portion is read to the logic portion through the n reading signal lines with use of the second clock frequency $L\alpha/n$ [Hz], and with use of the first clock frequency $K\alpha$ [Hz], the data read from the memory portion is converted by a parallel/serial conversion circuit included in the logic portion and then transmitted in serial to a circuit portion.

One embodiment of the present invention is a semiconductor device having a wireless communication function, which includes a memory portion, a logic portion, and a plurality of signal lines for electrically connecting the memory portion and the logic portion. In the case where a transfer rate between the semiconductor device and a communication device is $\alpha$ [bps], a first clock frequency is $K\alpha$ [Hz] (K is an integer of 1 or more), the number of reading signal lines of the plurality of signal lines is n (n is an integer of 2 or more), a second clock frequency is $L\alpha/n$ [Hz] (L is any integer satisfying $L/n<K$), one of the plurality of signal lines is a writing signal line, and a third clock frequency is M [Hz], a demodulated signal is decoded with use of the first clock frequency $K\alpha$ [Hz], data stored in the memory portion is read to the logic portion through the n reading signal lines with use of the second clock frequency $L\alpha/n$ [Hz], and data is written from the logic portion to the memory portion through the one writing signal line with use of the third clock frequency M [Hz]. Note that the third clock frequency M [Hz] may be determined as appropriate in accordance with the properties of a memory element, and M may be equal to Loin if there is no problem on operation.

One embodiment of the present invention is a semiconductor device having a wireless communication function, which includes a memory portion, a logic portion, and a plurality of signal lines for electrically connecting the memory portion and the logic portion. In the case where a transfer rate between the semiconductor device and a communication device is $\alpha$ [bps], a first clock frequency is $K\alpha$ [Hz] (K is an integer of 1 or more), the number of reading signal lines of the plurality of signal lines is n (n is an integer of 2 or more), a second clock frequency is $L\alpha/n$ [Hz] (L is any integer satisfying $L/n<K$), one of the plurality of signal lines is a writing signal line, and a third clock frequency is M [Hz], a demodulated signal is decoded with use of the first clock frequency $K\alpha$ [Hz], state information of a memory cell in the memory portion or data stored in the memory portion is read through the n reading signal lines with use of the second clock frequency $L\alpha/n$ [Hz], and data is written from the logic portion to the memory portion through the one writing signal line with use of the third clock frequency M [Hz].

In the above structures, the memory portion can be provided with a memory cell including a write-once memory element. The memory element may be an antifuse.

Also in the above structures, the memory portion can be provided with a memory cell including a memory element having a floating gate or a memory element using a magnetic material.

One embodiment of the present invention may also be an RFID tag including a semiconductor device having the above structures.

According to one embodiment of the present invention, lower power consumption of a semiconductor device can be realized, or the communication distance between a semiconductor device and a communication device can be increased.

According to one embodiment of the present invention, stable operation of a semiconductor device can be kept. Further, lower power consumption of a semiconductor device can be realized while keeping the stable operation thereof.

DETAILED DESCRIPTION OF THE INVENTION

Embodiments of the present invention will be described hereinafter. Note that the present invention is not limited to the description below, and it is apparent to those skilled in the art that modes and details can be modified in various ways without departing from the spirit and scope of the present invention. Accordingly, the present invention should not be construed as being limited to the description of the embodiments given below.

Embodiment 1

In this embodiment, a semiconductor device including at least a memory portion, a logic portion, and a plurality of signal lines (interface signal lines) for electrically connecting the memory portion and the logic portion, will be described. The semiconductor device described in this embodiment also functions as part of an RFID tag.

Figure 1:
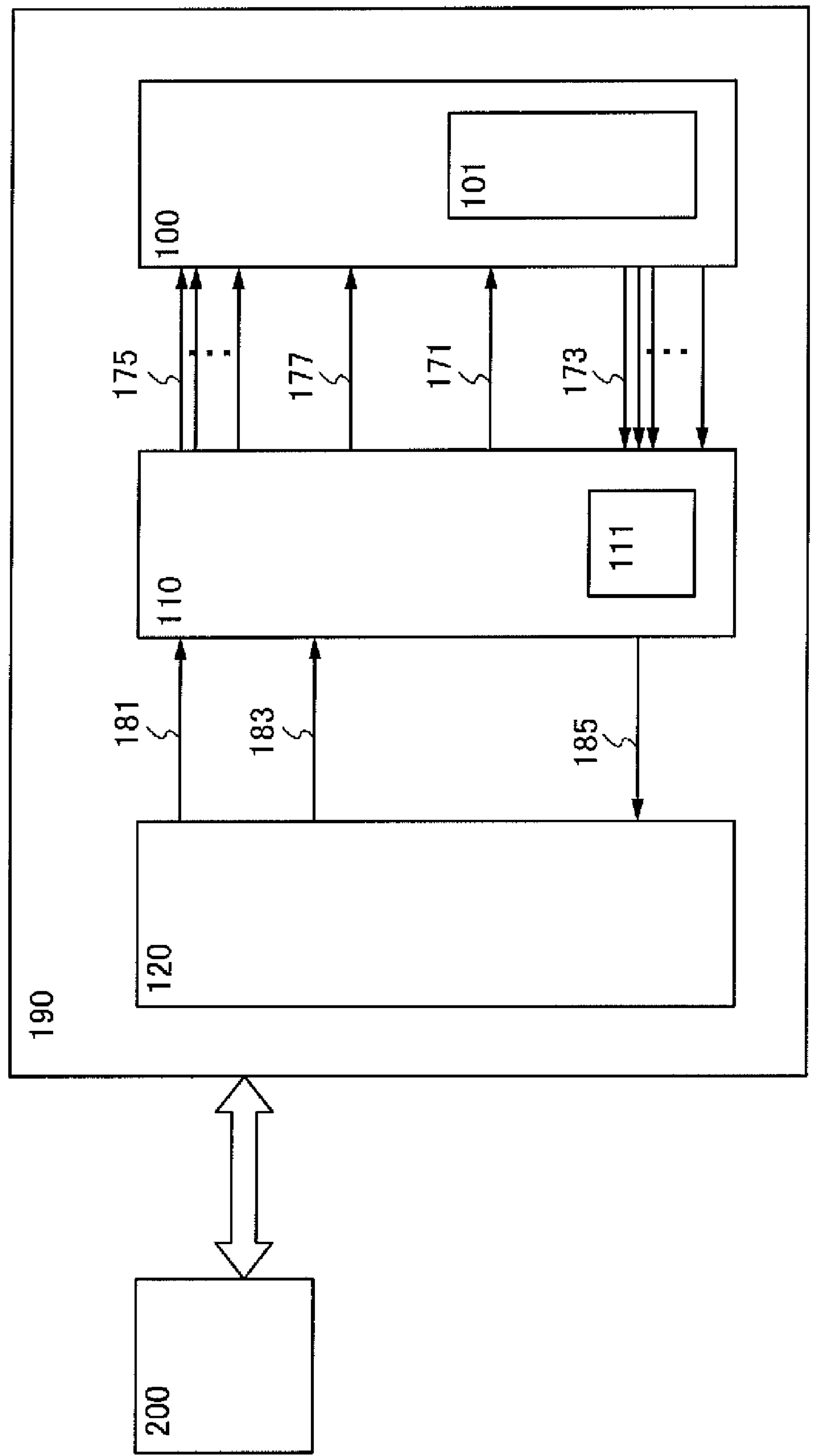
FIG. 1 is a schematic view illustrating a part of a semiconductor device of one embodiment of the present invention.

The semiconductor device of this embodiment will be described with reference to FIG. 1.

A semiconductor device 190 of this embodiment has a wireless communication function. Data is transmitted and received between the semiconductor device 190 and a communication device 200 in a non-contact manner. The semiconductor device 190 functions, for example, as part of an RFID tag. The communication device 200 is, for example, a reader/writer, a reader, or a writer, which transmits and receives, transmits, or receives data to or from the semiconductor device 190.

The semiconductor device 190 includes at least a memory portion 100, a logic portion 110, and a plurality of signal lines for electrically connecting the memory portion 100 and the logic portion 110. The plurality of signal lines include, in FIG. 1, a first signal line 171, second signal lines 173, a third signal line 175, and a fourth signal line 177. In this embodiment, the number of the second signal lines 173 is n (n is an integer of 2 or more).

It is preferable that the semiconductor device 190 include a circuit portion 120 having the function of demodulation, rectification, modulation, or the like for various processing operations. The circuit portion 120 and the logic portion 110 are electrically connected to each other through a plurality of signal lines (interface signal lines). The plurality of signal lines include, in FIG. 1, a fifth signal line 181, a sixth signal line 183, and a seventh signal line 185.

The configuration of the semiconductor device 190 and the flow of data processing will be described next.

The semiconductor device 190 includes the memory portion 100, the logic portion 110, and the circuit portion 120.

In the logic portion 110, a demodulated signal transmitted from the circuit portion 120 in serial is decoded to control the timing of writing to the memory portion 100, the reading address and writing address of the memory portion 100, or the like. A response signal is output from the logic portion 110 to the circuit portion 120 as needed. In this embodiment, a demodulated signal is transmitted in serial from the circuit portion 120 to the logic portion 110 through the fifth signal line 181. Further, a response signal is transmitted in serial from the logic portion 110 to the circuit portion 120 through the seventh signal line 185. Note that the logic portion 110 includes a parallel/serial conversion circuit 111 to perform parallel/serial conversion as appropriate.

The memory portion 100 includes a memory cell array 101. In the memory cell array 101, a plurality of memory cells are arranged.

In the memory portion 100, a writing voltage is generated to write data to the memory cells in the memory cell array 101. When data is written to the memory cell array 101, the writing data is transmitted in serial through the first signal line 171. In the memory cell array 101, the memory cells to be accessed are selected in sequence and data is written thereto.

When data is read from the memory cell array 101 in the memory portion 100, reading data is transmitted in parallel through the second signal lines 173. In the memory cell array 101, a plurality of memory cells to be accessed are selected almost at the same time and data is read therefrom almost at the same time. The data read here is data which has been written from the logic portion to the memory portion and then stored in the memory portion. The data may also include state information of the memory cells included in the memory portion.

The first signal line 171, the second signal lines 173, the third signal line 175, and the fourth signal line 177 are connected between the memory portion 100 and the logic portion 110.

The first signal line 171 is a writing signal line for transmitting writing data from the logic portion 110 to the memory portion 100. Here, the number of the first signal line 171 is one. The second signal lines 173 are reading signal lines for transmitting reading data from the memory portion 100 to the logic portion 110. Here, the number of the second signal lines 173 is n (n is an integer of 2 or more).

The third signal line 175 is an address line for selecting a memory cell to be accessed in the memory cell array 101. Here, the number of the third signal lines 175 is A (A is an integer of 1 or more). The fourth signal line 177 is a charge pump clock transmission line for transmitting a charge pump clock that controls writing voltage and writing timing in the memory portion 100.

In the logic portion 110, one or more clocks having frequencies necessary for various processing operations are generated with use of a clock input from the circuit portion 120 through the sixth signal line 183. At least one of the frequencies of the various clocks generated in the logic portion 110 is determined by a transfer rate which depends on a communication specification between the semiconductor device 190 and the communication device 200, and by an encoding method.

For example, in the case where the transfer rate between the semiconductor device 190 and the communication device 200 is $\alpha$ [bps], at least one of the frequencies of the clocks generated in the logic portion 110 has a frequency of $K\alpha$ [Hz] (K is an integer of 1 or more). This is because a clock having a frequency equal to or higher than the transfer rate (here, $\alpha$ [bps]) is necessary for decoding a demodulated signal which is transmitted in serial to the logic portion 110. Since the power consumption of the logic portion 110 is proportional to the clock frequency, K is preferably as small a value as possible. Note that in the case where the encoding method is Manchester encoding, the frequency is $K\alpha$ [Hz] (K is an integer of 2 or more). The clock frequency $K\alpha$ [Hz] is used to, for example, decode a demodulated signal.

Also in the logic portion 110 in this embodiment, a clock having a frequency of $L\alpha/n$ [Hz] ($L/n<K$, and L is any integer) and a clock having a frequency of M [Hz] are generated.

A demodulated signal input to the logic portion 110 is decoded with use of a clock having a frequency of $K\alpha$ [Hz] (K is an integer of 1 or more), whereby the input demodulated signal is judged to be a reading instruction or a writing instruction.

Described next is processing which is performed when a demodulated signal input to the logic portion 110 is a reading instruction.

When the logic portion 110 receives a reading instruction, the following processing 1 and processing 2 are preferably performed before data is read from the memory portion 100.

(Processing 1)

Before reading data which has been written to the memory cell array 101 in the memory portion 100, information of the memory cell array 101 is read. The information is, for example, state information of the memory cells such as the location of a defective memory cell that has occurred before. The location of a defective memory cell is identified by reading the state information of the memory cells.

Specifically, the logic portion 110 controls A third signal lines 175 to select a memory cell to be accessed, and information is read from the memory portion 100 through n second signal lines 173. When signals are input to the memory portion 100 through the third signal lines 175, n memory cells are accessed almost at the same time. Then, the state information of the n memory cells is read from the memory portion 100 at a time and transmitted in parallel to the logic portion 110. In the logic portion 110, n pieces of state information can be processed at a time. Accordingly, in the semiconductor device 190 of this embodiment, state information can be read with use of a clock having a frequency equal to 1/n of the frequency at which information is read through one signal line, namely, at which data is read in serial. Specifically, the processing 1 is preferably performed using a clock having a frequency of $L\alpha/n$ [Hz] ($L/n<K$, and L is any integer).

(Processing 2)

In the logic portion 110, depending on the state information of the memory cells read in the processing 1 or the like, transfer processing of memory cells to be accessed is performed as needed. The transfer processing means that the address of another memory cell is specified instead of an original address to be specified. This processing is performed because data might be written to a memory cell different from an original memory cell to be accessed due to the generation of a defective memory cell. The processing 2 is preferably performed using a clock having a frequency of $L\alpha/n$ [Hz] ($L/n<K$, and L is any integer).

After the above processing (here, the processing 1 and processing 2), in the logic portion 110, an address signal is generated to specify n memory cells by using a clock having a frequency of $L\alpha/n$ [Hz] ($L/n<K$, and L is any integer). Then, the address signal is transmitted from the logic portion 110 to the memory portion 100 through the A third signal lines 175. In the memory portion 100, the n memory cells that are specified by the address signal input through the third signal lines 175 are accessed almost at the same time. After that, data is read from the n memory cells almost at the same time and then is transmitted in parallel from the memory portion 100 to the logic portion 110 through the n second signal lines 173.

In the logic portion 110, with use of a clock having a frequency of $K\alpha$ [Hz] (K is an integer of 1 or more), the data that is read in parallel from the memory portion 100 is converted into serial data by the parallel/serial conversion circuit 111, whereby a response signal is generated. Then, the response signal is transmitted from the logic portion 110 to the circuit portion 120 through the seventh signal line 185.

As described above, in this embodiment, the n second signal lines 173 are connected as reading signal lines, so that n pieces of data (including state information or the like) can be transmitted in parallel between the memory portion 100 and the logic portion 110. Therefore, reading processing or the like can be performed using a clock having a frequency of $L\alpha/n$ [Hz] ($L/n<K$, and L is any integer) lower than the frequency $K\alpha$ [Hz] (K is an integer of 1 or more). Thus, in the case where a demodulated signal input to the logic portion 110 is a reading instruction, the processing is performed using either, as appropriate, a clock having a frequency of $L\alpha/n$ [Hz] ($L/n<K$, and L is any integer) or a clock having a frequency of $K\alpha$ [Hz] (K is an integer of 1 or more), resulting in a reduction in power consumption.

Described next is processing which is carried out when a demodulated signal input to the logic portion 110 is a writing instruction.

When the logic portion 110 receives a writing instruction, the following processing 1 and processing 2 are preferably performed before data is written to the memory portion 100.

(Processing 1)

Before writing data to the memory cell array 101 in the memory portion 100, information of the memory cell array 101 is read. The information is, for example, the location of a defective memory cell that has occurred before, or whether the number of times of rewriting to a memory cell to be accessed does not exceed the upper limit. The location of a defective memory cell or whether writing to a memory cell to be accessed is possible is identified by reading the state information of the memory cells.

Specifically, the processing 1 is performed in a manner similar to that described above, where the logic portion 110 receives a reading instruction. The logic portion 110 controls A third signal lines 175 to select a memory cell to be accessed, and information is read from the memory portion 100 through n second signal lines 173. When signals are input to the memory portion 100 through the third signal lines 175, n memory cells are accessed almost at the same time. Then, the state information of the n memory cells is read from the memory portion 100 at a time and transmitted in parallel to the logic portion 110. In the logic portion 110, n pieces of state information can be processed at a time. Accordingly, in the semiconductor device 190 of this embodiment, state information can be read with use of a clock having a frequency equal to 1/n of the frequency at which information is read through one signal line, namely, at which data is read in serial. Specifically, the processing 1 is preferably performed using a clock having a frequency of $L\alpha/n$ [Hz] ($L/n<K$, and L is any integer).

(Processing 2)

The processing 2 is also performed in a manner similar to that described above, where the logic portion 110 receives a reading instruction. In the logic portion 110, depending on the state information of the memory cells read in the processing 1 or the like, transfer processing of memory cells to be accessed is performed as needed. The processing 2 is preferably performed using a clock having a frequency of $L\alpha/n$ [Hz] ($L/n<K$, and L is any integer).

After the aforementioned processing (here, the processing 1 and processing 2), the logic portion 110 generates a clock having a frequency of M [Hz] which is determined in accordance with the properties of a memory element. Note that M may be equal to $L\alpha/n$ if there is no problem on operation. In general, fewer kinds of clock frequencies can simplify an inner structure of a semiconductor device. In the logic portion 110, an address signal is generated with use of a clock having a frequency of M [Hz] and then transmitted to the memory portion 100 through the third signal lines 175. Further from the logic portion 110, an instruction to generate a writing voltage is transmitted to the memory portion 100 through the fourth signal line 177 (charge pump clock transfer line) and writing data is transmitted to the memory portion 100 through the first signal line 171.

In the memory portion 100, memory cells specified by the address signal input through the third signal lines 175 are accessed in sequence, and the data transmitted in serial through the first signal line 171 is written to the memory cells in sequence. In such a manner, the data can be written to the memory portion 100.

After the writing processing, the writing state of the memory cells to be accessed is preferably checked in the logic portion 110. This is because if there is a defective memory cell among the memory cells to be accessed, writing data might not be properly stored in the memory cell. The writing state of the memory cells can be checked, for example, by reading data of a corresponding memory cell after the writing processing (immediately after data is written), and comparing its data with writing data. At this time, the data of the memory cell can be read through the n second signal lines 173 preferably by using a clock having a frequency of $L\alpha/n$ [Hz] ($L/n<K$, and L is any integer).

In the case where writing data is not properly stored in the memory cell, the data is rewritten to the same memory cell from the logic portion 110. Alternatively, transfer processing of the memory cell is performed so that the data is written to another memory cell from the logic portion 110. Further, the location information of a defective memory cell may be written to a predetermined memory cell as the state information of the memory cell. The number of predetermined memory cells may be one or more. The writing processing is performed using a clock having a frequency of M [Hz]. M may be equal to $L\alpha/n$ ($L/n<K$, and L is any integer) if there is no problem on operation.

In the logic portion 110, with use of a clock having a frequency of $K\alpha$ [Hz] (K is an integer of 1 or more), a response signal is generated in accordance with the writing state of the memory portion 100. Then, the response signal is transmitted from the logic portion 110 to the circuit portion 120 through the seventh signal line 185.

In the case where a demodulated signal input to the logic portion 110 is a writing instruction, the writing processing itself is performed using a clock having a frequency of M [Hz]. However, in reading processing accompanying the writing processing, such as obtaining state information of memory cells or checking the writing state, data can be transmitted in parallel through the n second signal lines 173 with use of a clock having a frequency of $L\alpha/n$ [Hz] ($L/n<K$, and L is any integer) lower than the frequency $K\alpha$ [Hz] (K is an integer of 1 or more); thus, power consumption can be reduced. In this manner, the writing processing and the accompanying processing are performed using any of the following clocks: a clock having a frequency of M [Hz]; a clock having a frequency of $L\alpha/n$ [Hz] ($L/n<K$, and L is any integer); and a clock having a frequency of $K\alpha$ [Hz] (K is an integer of 1 or more), resulting in a reduction in power consumption.

As described in this embodiment, when a semiconductor device having a wireless communication function includes a plurality of signal lines between a memory portion and a logic portion and includes n signal lines (n is an integer of 2 or more) for reading processing, a reduction in the power consumption of the semiconductor device can be achieved. Therefore, the application of this embodiment to a semiconductor device such as an RFID tag results in an increase in communication distance.

Note that the structure shown in this embodiment can be combined as appropriate with any of the structures of the other embodiments in this specification.

Embodiment 2

In this embodiment, a memory portion included in a semiconductor device will be described.

A feature of the semiconductor device of this embodiment, which includes at least a memory portion, is that data is processed by a plurality of transmission methods in the memory portion. Specifically, writing processing and reading processing are performed by different transmission methods: data is transmitted in serial for writing processing and data is transmitted in parallel for reading processing. By transmitting data in serial, writing processing is performed while stable operation of the semiconductor device is secured. By transmitting data in parallel, reading processing is performed while the clock frequency is lowered.

Note that in the writing processing, reading processing for obtaining state information of a memory cell or the like is performed in some cases in addition to writing processing of data. When data is read from a memory cell, even in course of writing processing, the data is read in parallel as in the reading processing of the memory portion.

In the case where writing processing is performed in the memory portion, writing data is transmitted in serial to a memory cell array. In the memory cell array, memory cells to be accessed are selected in sequence and data is written thereto. Note that it is possible, but undesirable in terms of power consumption, to transmit writing data in parallel to the memory cell array.

In the case where reading processing is performed in the memory portion, reading data is transmitted in parallel from a memory cell array. In the memory cell array, memory cells to be accessed are selected almost at the same time and data is read therefrom almost at the same time.

In the memory portion, data is processed in synchronization with a clock. On the assumption that reading processing in the memory portion is performed in the same period, data can be read in parallel at a lower frequency than in the case where data is read in serial. As a result, power consumption can be reduced.

In order to keep stable operation of the semiconductor device while reducing the power consumption thereof, it is important to process data by a transmission method appropriate for the kind of processing (writing processing or reading processing) as shown in this embodiment. As described above, in order to reduce power consumption, data is preferably transmitted in parallel for reading processing; however, data is preferably transmitted in serial for writing processing because of the following reason. In particular, data is preferably written in serial in the case where, for example, a write-once memory element (e.g., an antifuse) to which data is written by a short-circuit, is used for a memory cell.

When data is written in parallel to a memory cell array using an antifuse, it is difficult to simultaneously apply a writing voltage to selected antifuses and to simultaneously short-circuit the selected antifuses. Consequently, there is high possibility that the antifuses are short-circuited at different times. When one of the antifuses in the memory cell array is short-circuited, a writing voltage applied to the other antifuses is lowered, which may lead to difficulty in continuing the writing processing.

It is also difficult to simultaneously write data in parallel to selected memory cells in the case where power necessary for writing data to a memory cell is relatively high compared to the power of a semiconductor device (typically, an RFID tag), which is obtained from a communication device (typically, a reader/writer).

Therefore, in the data processing of the memory portion, it is preferable that writing data be transmitted in serial and reading data be transmitted in parallel. In such a manner, stable operation of the semiconductor device including the memory portion can be kept while the power consumption thereof is reduced Next, a configuration example of a memory portion in this embodiment will be described with reference to FIG. 2.

A memory portion 100 includes at least a memory cell array 101. The memory portion 100 in this embodiment includes, in addition to the memory cell array 101, a row address decoder 103, a column address decoder 105, a word line driver circuit 107, a bit line driver circuit and reading circuit 109 (in FIG. 2, a circuit 109 having a bit line driver circuit **109*a* and a reading circuit 109*b*), an interface 113, a writing power supply generating circuit 115**, and the like.

In the memory cell array 101, a plurality of memory cells are arranged. The memory cell array 101 includes, for example, a plurality of word lines, a plurality of bit lines intersecting the word lines, and a plurality of memory cells connected to the word lines and the bit lines. Desired data can be written to and read from the memory cell array 101. The memory cells each include a write-once memory or a non-volatile memory such as a rewritable memory. As a write-once memory, a fuse memory element, an antifuse memory element, or the like can be used. As a non-volatile memory, it is possible to use a transistor having a floating gate, a memory element using a magnetic material, a phase-change memory element, or the like.

The row address decoder 103 and the column address decoder 105 select a word line and a bit line, respectively. In this embodiment, the row address decoder 103 selects a word line through the word line driver circuit 107; and the column address decoder 105 selects a bit line through the bit line driver circuit and reading circuit 109.

When the row address decoder 103 and the column address decoder 105 select a word line and a bit line, respectively, a memory cell connected to the selected word line and bit line can be accessed. In other words, a desired memory cell can be accessed when a word line and a bit line connected to the memory cell to be accessed are selected by the row address decoder 103 and the column address decoder 105.

When writing processing is performed in the memory portion 100, the word line driver circuit 107 and the bit line driver circuit 109*a* stably transmit a signal to the word line and the bit line selected by the row address decoder 103 and the column address decoder 105, respectively.

When reading processing is performed in the memory portion 100, the word line driver circuit 107 stably transmits a signal of a word line selected by the row address decoder 103 to the memory cell array 101. Further, the reading circuit 109*b* inputs a signal of a bit line selected by the column address decoder 105, reads data of the selected memory cell, and transmits it to another circuit.

The bit line driver circuit and reading circuit 109 is connected to n (n is an integer of two or more) signal lines 173. The memory portion 100 is electrically connected to other circuits through the n signal lines 173 connected to the bit line driver circuit and reading circuit 109. Data is transmitted through the n signal lines 173.

Figure 2:
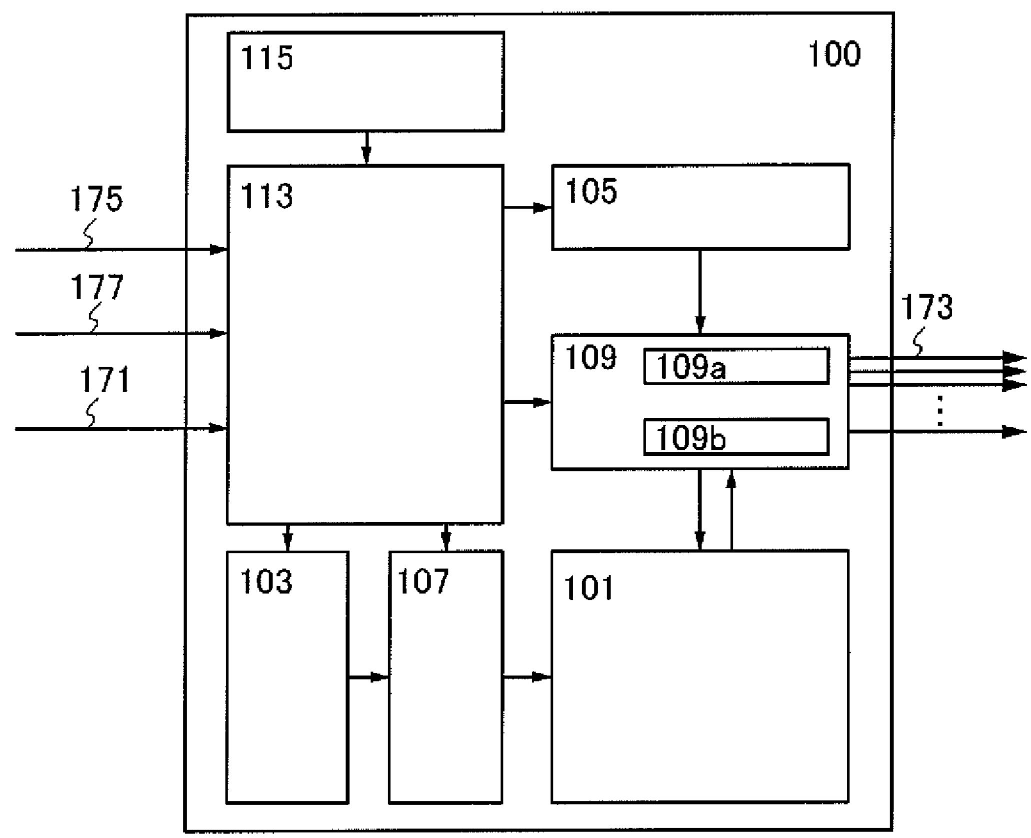
FIG. 2 is a schematic view illustrating a part of a semiconductor device of one embodiment of the present invention.

The interface 113 is a circuit which, for example, electrically connects the memory portion 100 to other circuits and converts the data format so that the data can be transmitted therebetween. FIG. 2 illustrates an example in which writing data, an address, and a charge pump clock are input from the outside of the memory portion 100 to the interface 113 through the first signal line 171, the third signal line 175, and the fourth signal line 177, respectively.

The writing power supply generating circuit 115 is used when writing processing is performed in the memory portion 100. The writing power supply generating circuit 115 generates a voltage (a writing voltage) needed to write data to the memory cell array 101. A writing voltage is applied from the writing power supply generating circuit 115 to a memory cell in the memory cell array 101 through the interface 113.

A feature of this embodiment is that data is processed by a plurality of transmission methods in the memory portion 100. In the memory portion 100, data is transmitted to the memory cell array 101 in serial for writing processing and data is transmitted from the memory cell array 101 in parallel for reading processing.

The address of a memory cell to be accessed in writing processing and reading processing is determined by an address signal input to the interface 113. In accordance with the address signal, the row address decoder 103 and the column address decoder 105 select a memory cell to be accessed.

In the case where writing processing is performed in the memory portion 100, writing data is transmitted in serial to the memory cell array 101. In accordance with an address signal input through the interface 113, a memory cell to be accessed is selected by the row address decoder 103 and the column address decoder 105. Writing data is transmitted to the selected memory cell through the bit line driver circuit and reading circuit 109 (the bit line driver circuit 109*a*). Since data is transmitted in serial in the case of the writing processing, memory cells to be accessed are selected in sequence and the data is written to the selected memory cells in sequence. Writing to the memory cells is sequentially performed by applying a writing voltage to the memory cells to be accessed.

Specifically, each memory cell is sequentially accessed through a word line and a bit line selected by the row address decoder 103 and the column address decoder 105, and data is sequentially written to each memory cell. Writing data to each memory cell in sequence means that data is written in serial to the memory cells.

In the case where reading processing is performed in the memory portion 100, reading data is transmitted in parallel from the memory cell array 101. In accordance with an address signal input through the interface 113, a plurality of memory cells to be accessed are selected by the row address decoder 103 (or the row address decoder 103 and the column address decoder 105). Reading data is transmitted from the selected memory cells through the bit line driver circuit and reading circuit 109 (the reading circuit 109*b*). Since data is read in parallel in the case of the reading processing, a plurality of memory cells to be accessed are selected at the same time and the data is read from the selected memory cells almost at the same time.

Specifically, a plurality of memory cells are accessed through a word line selected by the row address decoder 103, and data is read from the memory cells at the same time. The data read is transmitted in parallel through the n signal lines 173 connected to the bit line driver circuit and reading circuit 109. In the memory portion 100, the same number of (n) memory cells as the n signal lines 173 can be accessed almost at the same time through the n signal lines 173, and data stored in the n memory cells can be read almost at the same time. Reading data stored in the same number of (n) memory cells as the n signal lines 173 at the same time means that data is read in parallel from the memory cells.

In the reading processing, through only word lines selected by the row address decoder 103, a plurality of memory cells connected to the selected word lines can be accessed almost at the same time. Alternatively, a plurality of memory cells can be accessed almost at the same time not only through word lines selected by the row address decoder 103, but also through a plurality of bit lines selected by the column address decoder 105.

Figure 3A:
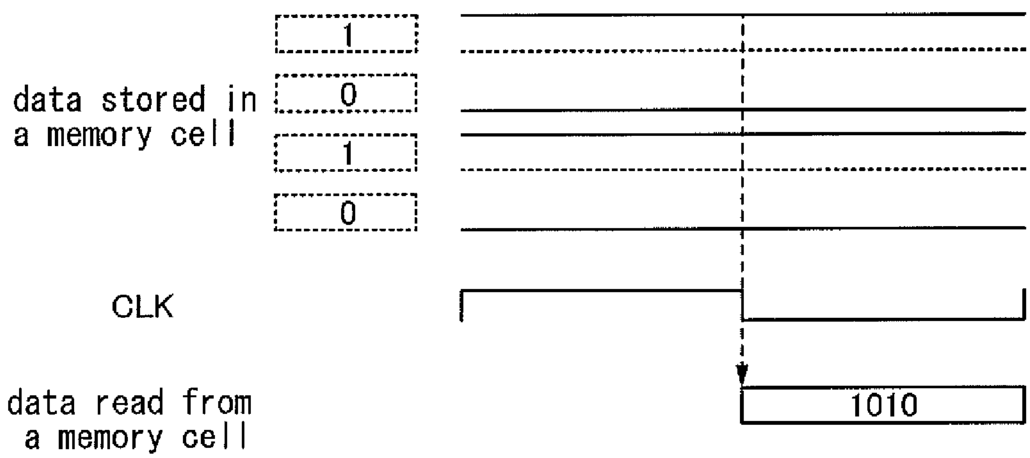
FIGS. 3A and 3B are diagrams each illustrating a transmission method.
Figure 3B:
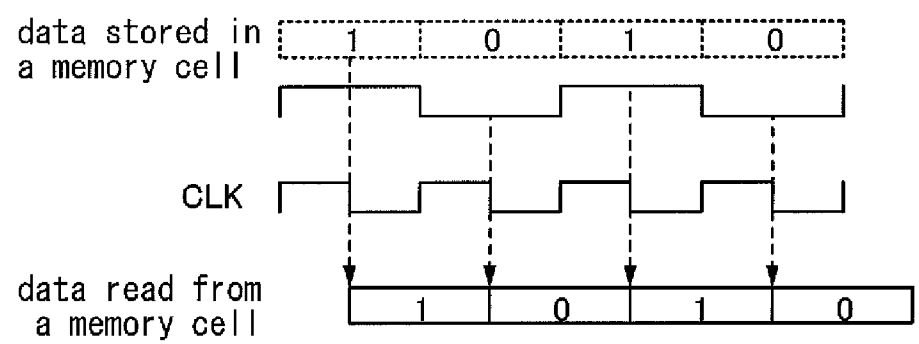

FIGS. 3A and 3B each illustrate an example of reading data "1010".

In FIG. 3A, data "1010" is read in parallel, which is a transmission method used in one embodiment of the present invention. On the other hand, data "1010" is read in serial in FIG. 3B. As seen from the comparison of FIG. 3A and FIG. 3B, data can be read in parallel at a lower clock (CLK) frequency than in the case where data is read in serial. Thus, when data is read in parallel as in one embodiment of the present invention, less power is consumed than when data is read in serial.

An example of reading data "1010" is illustrated in FIGS. 3A and 3B; however, it is needless to say that the same applies to the case of reading other data: when data is read in parallel, less power is consumed than when data is read in serial.

As shown in this embodiment, the power consumption of a semiconductor device including a memory portion can be reduced by data processing using a plurality of transmission methods. In addition, stable operation of the semiconductor device can be kept by data processing using a transmission method appropriate for the kind of processing. Furthermore, since low power consumption and stable operation of the semiconductor device are achieved, the communication distance can be increased by applying this embodiment to a semiconductor device transmitting and receiving data in a non-contact manner, such as an RFID tag.

Note that the structure shown in this embodiment can be combined as appropriate with any of the structures of the other embodiments in this specification.

Embodiment 3

In this embodiment, a semiconductor device having a wireless communication function will be described. The semiconductor device of this embodiment can transmit and receive data in a non-contact manner, and also functions as an RFID tag.

Figure 4:
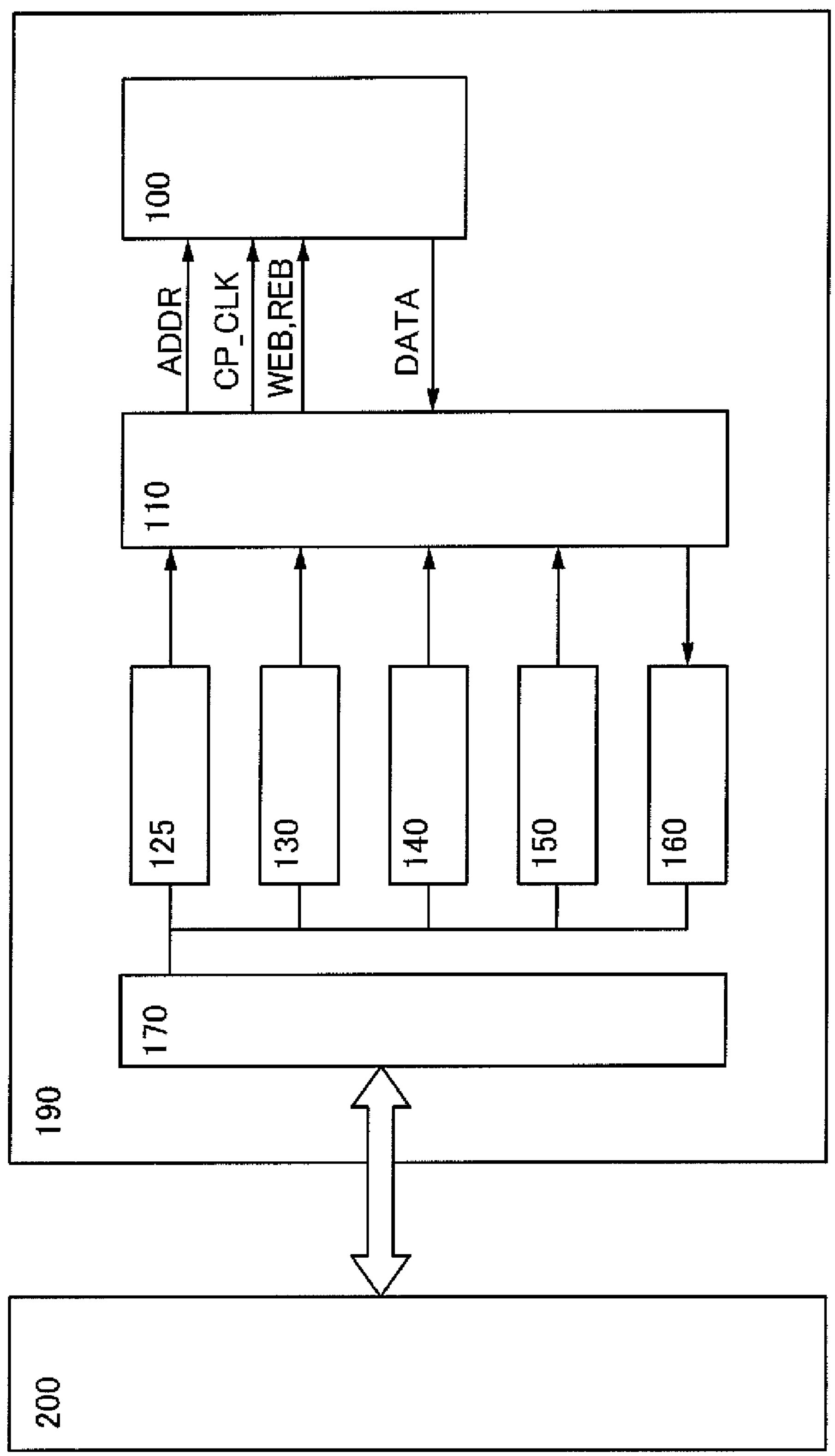
FIG. 4 is a schematic view illustrating a semiconductor device and a communication device of one embodiment of the present invention.

FIG. 4 is a schematic view of the semiconductor device (RFID tag) of this embodiment. FIG. 4 also illustrates a communication device which communicates data with the semiconductor device.

A semiconductor device 190 includes a memory portion 100, a logic portion 110, a rectification circuit 125, a demodulation circuit 130, a reset circuit 140, a clock generation circuit 150, a modulation circuit 160, an antenna 170, and the like.

The memory portion 100 has the above configuration shown in Embodiment 2. In the memory portion 100, data is processed by a plurality of transmission methods: data is transmitted in serial for writing processing and data is transmitted in parallel for reading processing. When data is read from a memory cell, even in course of writing processing, the data is read in parallel as in the reading processing of the memory portion. By data processing using a transmission method appropriate for the kind of processing, power consumption can be reduced and stable operation can be kept.

In the logic portion 110, an input demodulated signal is decoded and predetermined processing is performed in accordance with a command signal received from the communication device 200. A response signal is output from the logic portion 110 to the modulation circuit 160 as needed. The predetermined processing includes control of the memory portion 100, specifically, control of the kind of processing (writing processing or reading processing), control of a decoder (e.g., the row address decoder 103 and the column address decoder 105 illustrated in FIG. 2), control of the timing of driving a writing power supply generating circuit (the writing power supply generating circuit 115 in FIG. 2), and the like.

The rectification circuit 125 rectifies an AC signal received by the antenna 170, thereby generating a power supply voltage. The demodulation circuit 130 demodulates an AC signal received by the antenna 170, and supplies the demodulated signal to the logic portion 110. The reset circuit 140 produces a reset signal from an AC signal received by the antenna 170, and supplies the reset signal to the logic portion 110.

The clock generation circuit 150 generates a clock needed to operate the logic portion 110, the memory portion 100, and the like, and transmits the clock to the logic portion 110, the memory portion 100, and the like. The clock generation circuit 150 includes a capacitor or the like, so that a clock can be generated in accordance with the frequency of an AC signal received by the antenna 170 and a DC bias component can be removed. If needed, a clock division circuit may be provided between a negative (or positive) electrode of the capacitor, and the logic portion 110, the memory portion 100, or the like.

The modulation circuit 160 generates a modulated AC signal with use of a response signal output from the logic portion 110.

Data is transmitted and received between the semiconductor device 190 and the communication device 200 (through wireless communication). In the antenna 170, an electromagnetic wave or an electromagnetic field generated from the communication device 200 is converted into an AC signal.

The communication device 200 is specifically a reader/writer, a reader, a writer, or the like which transmits and receives data to and from the semiconductor device 190 (through wireless communication).

The semiconductor device 190 receives a signal transmitted from the communication device 200 and generates power to operate. Further, the semiconductor device 190 receives a signal transmitted from the communication device 200, so that data can be written to and read from the memory portion 100 included in the semiconductor device 190. The data read from the memory portion 100 can be output (transmitted) to the communication device 200.

In the memory portion 100 of this embodiment, data is transmitted in serial for writing processing and data is transmitted in parallel for reading processing.

For example, a signal transmitted from the communication device 200 is received by the antenna 170 in the semiconductor device 190. The received signal (AC signal) is transmitted from the antenna 170 to the rectification circuit 125, the demodulation circuit 130, the reset circuit 140, and the clock generation circuit 150. In the rectification circuit 125, the AC signal is rectified so that a power supply voltage is generated and supplied to the logic portion 110. In the demodulation circuit 130, the AC signal is demodulated and the demodulated signal is transmitted to the logic portion 110. In the reset circuit 140, a reset signal is generated from the AC signal and transmitted to the logic portion 110. In the clock generation circuit 150, a clock is generated from the AC signal and transmitted to the logic portion 110. In the modulation circuit 160, a modulated AC signal is generated with use of a response signal transmitted from the logic portion 110.

In the case where a signal transmitted from the communication device 200 is a writing signal, a command signal including an address signal (ADDR), a writing signal (WEB), and a charge pump clock (CP_CLK) is transmitted from the logic portion 110 to the memory portion 100.

In the memory portion 100, writing processing is performed in accordance with the transmitted signal. Writing processing in the memory portion 100 is specifically performed in the same manner as that described above in Embodiment 1, and data is written in serial. In the memory portion 100, each memory cell is sequentially accessed and data is sequentially written to each memory cell.

In the case where a signal transmitted from the communication device 200 is a reading signal, a command signal including an address signal (ADDR) and a reading signal (REB) is transmitted from the logic portion 110 to the memory portion 100.

In the memory portion 100, reading processing is performed in accordance with the transmitted signal. Reading processing in the memory portion 100 is specifically performed in the same manner as that described above in Embodiment 1, and data is read in parallel. In the memory portion 100, the n (n is an integer of 2 or more) memory cells are accessed almost at the same time, and data is read from the n memory cells almost at the same time Note that the memory portion 100 is electrically connected to the logic portion 110 through the n signal lines, and data can be read from n memory cells through the n signal lines. That is, data is read in parallel.

The data read from the memory portion 100 is transmitted as a response signal from the logic portion 110 to the modulation circuit 160. In the modulation circuit 160, a modulated AC signal is generated with use of the received response signal, and then the signal (the data read from the memory portion) is transmitted to the communication device 200 through the antenna 170.

Since data is processed by a plurality of transmission methods in the memory portion 100, the logic portion 110 consumes less power in data transmitting in the memory portion 100, resulting in a reduction in the power consumption of the whole semiconductor device 190. As a result, the minimum operating power of the semiconductor device 190 can be reduced and the communication distance between the semiconductor device 190 and the communication device 200 can be increased.

Specifically, data is transmitted in parallel for reading processing in the memory portion 100, which makes it possible to lower the clock frequency of the logic portion and to reduce the power consumption of the semiconductor device 190.

Also in the memory portion 100, data is processed by a plurality of transmission methods, specifically, by a transmission method appropriate for the kind of processing; as a result, stable operation of the semiconductor device 190 can be kept. More specifically, data is transmitted in serial for writing processing in the memory portion 100, which makes it possible to keep stable operation of the semiconductor device 190.

Further, in the case where a battery is incorporated in the semiconductor device 190, the reduction in power consumption described in this embodiment allows extending the battery life. Accordingly, the battery incorporated in the semiconductor device needs to be replaced less often. It is also possible to reduce the size of the battery incorporated in the semiconductor device.

Figure 5:
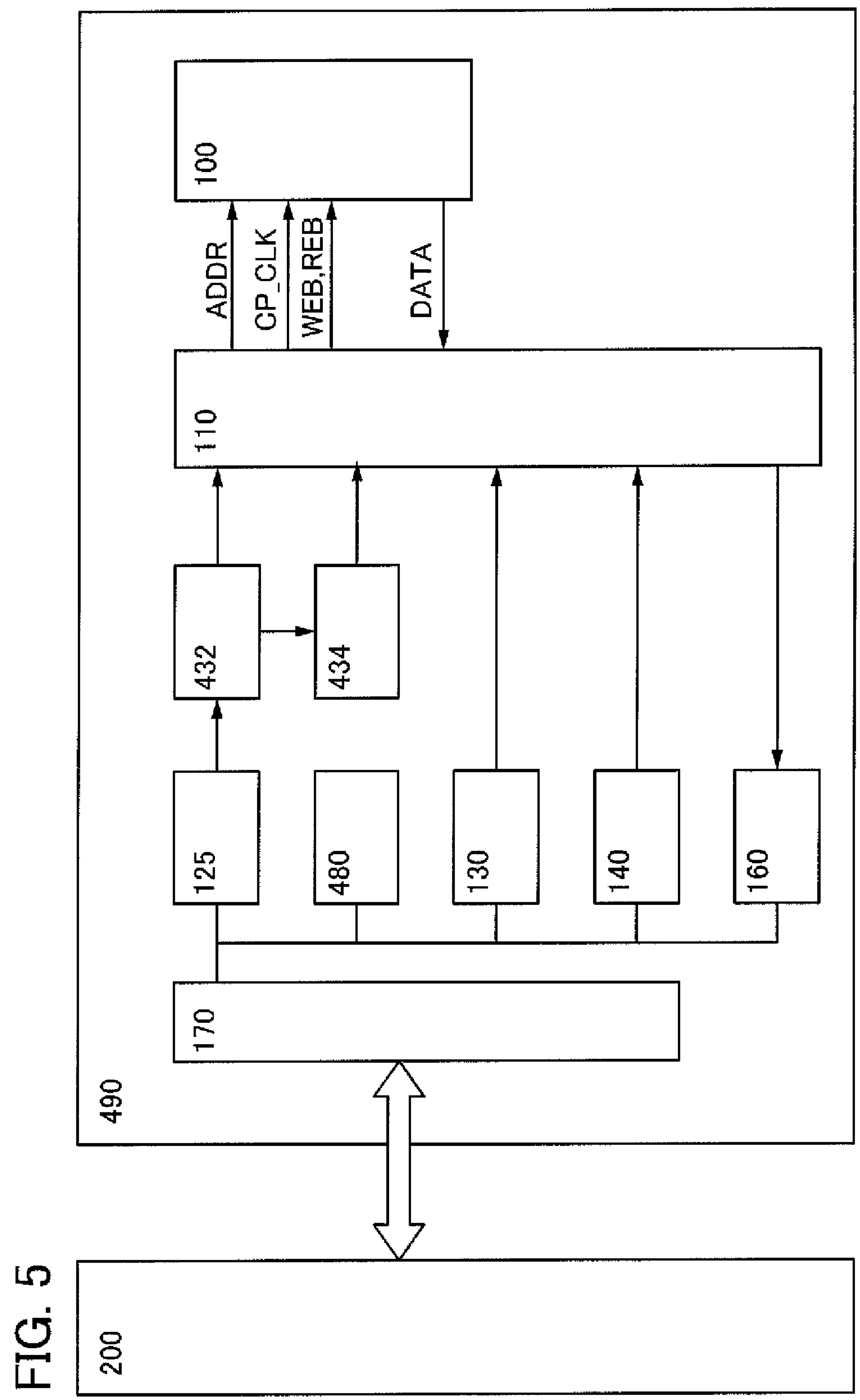
FIG. 5 is a schematic view illustrating a semiconductor device and a communication device of one embodiment of the present invention.

FIG. 5 illustrates a semiconductor device 490 having a structure different from that illustrated in FIG. 4. The semiconductor device 490 includes a limiter circuit 480, a regulator circuit 432, and a clock generation circuit 434, in addition to the memory portion 100, the logic portion 110, the rectification circuit 125, the demodulation circuit 130, the reset circuit 140, the modulation circuit 160, and the antenna 170.

The limiter circuit 480 is a control circuit which prevents power exceeding a predetermined value from being supplied to other circuits in the case where high power (internally generated voltage) is generated from a signal received by the antenna 170. The limiter circuit 480 prevents damage of other circuits due to excessive power generated by a too short communication distance or the like.

The regulator circuit 432 is a control circuit which prevents a voltage exceeding a predetermined value from being supplied to other circuits in the case where a high power supply voltage is generated by the rectification circuit 125. In addition, the regulator circuit 432 reduces variations in a power supply voltage (the amount of change in the amplitude relative to the average value of a power supply voltage) generated by the rectification circuit 125, so that a constant voltage is supplied to the logic portion 110.

The clock generation circuit 434 generates a clock. In accordance with a constant voltage produced by the regulator circuit 432, a clock needed to operate the logic portion 110, the memory portion 100, and the like is generated and transmitted to the logic portion 110, the memory portion 100, and the like. The clock generation circuit 434 includes a voltage controlled oscillator (VCO) or the like.

Also in the semiconductor device 490 illustrated in FIG. 5, data is processed by a plurality of transmission methods in the memory portion 100, whereby the logic portion 110 consumes less power in data transmitting in the memory portion 100, resulting in a reduction in the power consumption of the whole semiconductor device 190. As a result, the minimum operating power of the semiconductor device 490 can be reduced and the communication distance between the semiconductor device 490 and the communication device 200 can be increased. In addition, the limiter circuit, the regulator circuit, the clock generation circuit, and the like allow an increase in the operation stability of the semiconductor device functioning as an RFID tag.

Note that the structure shown in this embodiment can be combined as appropriate with any of the structures of the other embodiments in this specification.

Embodiment 4

In this embodiment, a semiconductor device (an RFID tag) having a wireless communication function, which uses an antifuse as a memory element in a memory portion, will be described.

Figure 6A:
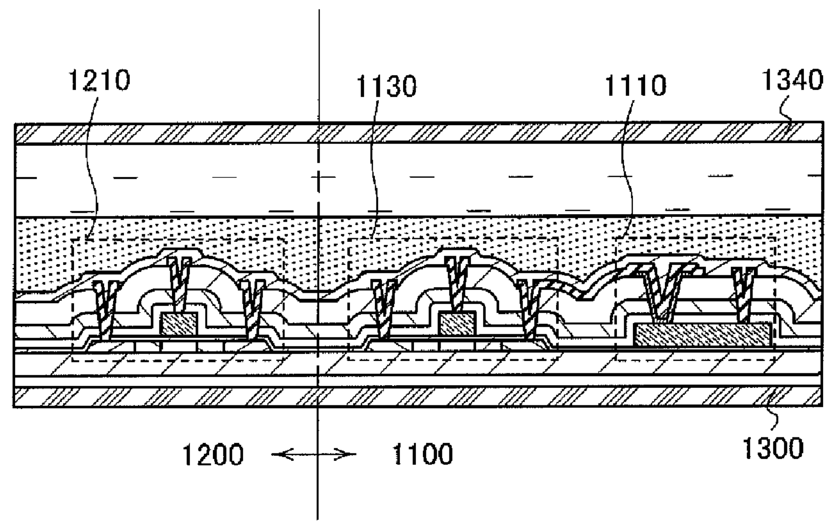
FIGS. 6A and 6B are schematic cross-sectional views illustrating a semiconductor device of one embodiment of the present invention.

In a semiconductor device illustrated in FIG. 6A, a memory portion 1100 and another circuit portion 1200 are provided over the same substrate. The other circuit portion 1200 includes, for example, a logic portion, a clock division circuit, a clock generation circuit, an input/output circuit, or a power supply circuit. Although not illustrated here, an antenna is provided if the semiconductor device has a wireless communication function. Note that the antenna may be provided over the same substrate as the memory portion 1100 and the other circuit portion 1200.

The memory portion 1100 includes a memory element 1110 and a transistor 1130. This embodiment shows an example of using an antifuse as the memory element 1110. The other circuit portion 1200 includes a transistor 1210. FIG. 6A illustrates a cross section of the memory portion 1100 including one transistor and one antifuse for convenience; however, the number of transistors and antifuses is not limited to one. Similarly, the number of transistors in the other circuit portion 1200 is not limited to one, although a cross section of one transistor is illustrated for convenience.

Figure 6B:
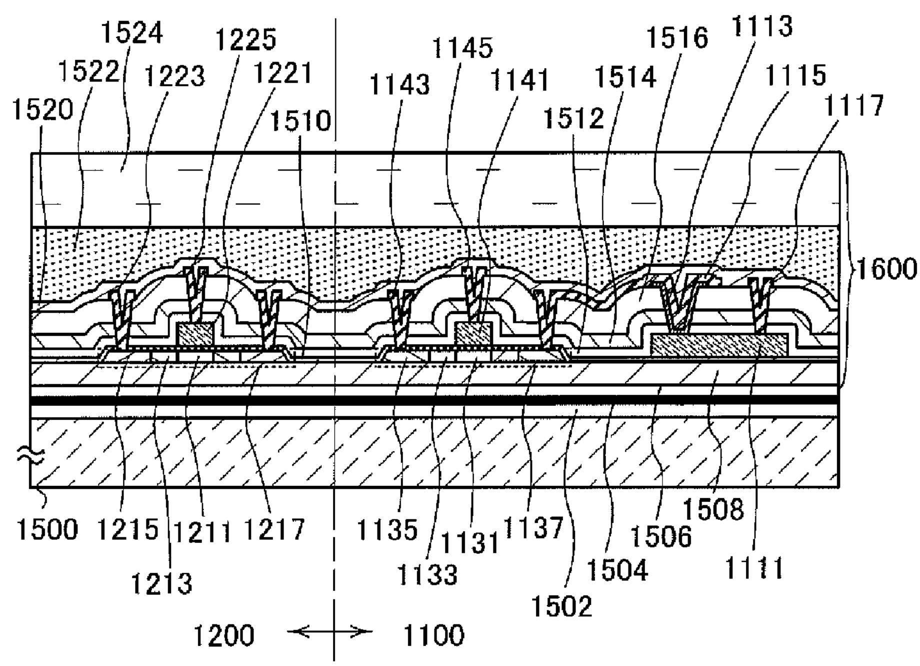

FIG. 6B is a cross-sectional view illustrating one manufacturing step of the semiconductor device illustrated in FIG. 6A. A method for manufacturing the semiconductor device of this embodiment will be described below with reference to FIGS. 6A and 6B.

First, an insulating layer 1502, a separation layer 1504, an insulating layer 1506, and an insulating layer 1508 are stacked in this order over a supporting substrate 1500.

As the supporting substrate 1500, a substrate having an insulating surface, such as a glass substrate or a quartz substrate is used.

As the separation layer 1504, a tungsten layer with a thickness of 50 nm to 200 nm (e.g., 50 nm) is used. As the separation layer 1504, it is also possible to use a metal layer such as a molybdenum layer or a titanium layer as well as the tungsten layer given above; a stacked-layer structure of the metal layer, and a metal oxide (e.g., tungsten oxide) layer of any of these or a metal nitride (e.g., tungsten nitride) layer of any of these; an amorphous silicon layer; or the like. As the insulating layer 1502, the insulating layer 1506, and the insulating layer 1508, a silicon oxide layer, a silicon oxynitride layer, a silicon nitride oxide layer, a silicon nitride layer, or stacked layers of these is formed. For example, a silicon oxynitride layer is formed as the insulating layer 1502, a silicon oxynitride layer is formed as the insulating layer 1506, and a stacked film of a silicon nitride layer, a silicon oxynitride layer, a silicon nitride oxide layer, and a silicon oxynitride layer is formed as the insulating layer 1508.

In the case where a metal layer such as a tungsten layer is formed as the separation layer 1504 and an oxide layer such as a silicon oxide layer or a silicon oxynitride layer is formed as the insulating layer 1506, a layer containing an oxide of a metal used for the separation layer may be formed between the metal layer and the oxide layer. Similarly, in the case where a nitride layer such as a silicon nitride layer or a silicon nitride oxide layer is formed as the insulating layer 1506, a layer containing a nitride of a metal used for the separation layer may be formed between the metal layer and the nitride layer.

Next, a semiconductor layer 1217 and a semiconductor layer 1137 are formed over the insulating layer 1508. The semiconductor layer 1217 and the semiconductor layer 1137 can be formed in such a manner that an amorphous silicon layer is formed on the entire surface by CVD or sputtering and crystallized to form a polycrystalline silicon layer, and then the polysilicon layer is selectively etched. The amorphous silicon layer can be crystallized by laser crystallization, thermal crystallization using rapid thermal annealing (RTA) or an annealing furnace, crystallization using a metal element that promotes crystallization, or a method combining them. Note that microcrystalline silicon or single crystal silicon may be used for the semiconductor layer 1217 and the semiconductor layer 1137. Furthermore, in order to control the threshold voltage of a thin film transistor to be completed later, a small amount of impurity element (an impurity element imparting n-type conductivity or an impurity element imparting p-type conductivity) may be added to the semiconductor layer 1217 and the semiconductor layer 1137. Note that in each of the semiconductor layer 1217 and the semiconductor layer 1137, a channel formation region of a thin film transistor to be completed later is formed. The semiconductor layer including a channel formation region of a thin film transistor preferably has a crystalline structure so as to realize high-speed driving of a driver circuit. High-speed driving of a driver circuit results in high-speed reading of data from a memory.

Then, a gate insulating layer 1510 is formed over the semiconductor layer 1217 and the semiconductor layer 1137. As the gate insulating layer 1510, a silicon oxide layer or a silicon oxynitride layer with a thickness of 1 nm to 200 nm (e.g., 10 nm) is formed by CVD or sputtering. Alternatively, the gate insulating layer 1510 can be formed in such a manner that the semiconductor layer 1217 and the semiconductor layer 1137 are subjected to surface oxidation treatment or surface nitridation treatment which uses plasma excited by a microwave. Further alternatively, the gate insulating layer 1510 can be formed in such a manner that an insulating layer is formed over the semiconductor layer 1217 and the semiconductor layer 1137 and then subjected to surface oxidation treatment or surface nitridation treatment.

Next, a gate electrode 1221 which overlaps the semiconductor layer 1217 with the gate insulating layer 1510 interposed therebetween, and a gate electrode 1141 which overlaps the semiconductor layer 1137 with the gate insulating layer 1510 interposed therebetween, are formed. Further, a first electrode 1111 serving as one electrode of an antifuse is formed by processing the same layer in the same process as the gate electrode 1221 and the gate electrode 1141. The gate electrode 1221, the gate electrode 1141, and the first electrode 1111 are formed of a substance such as tungsten, titanium, aluminum, nickel, chromium, molybdenum, tantalum, cobalt, zirconium, vanadium, palladium, hafnium, platinum, or iron, or an alloy or a compound of any of these. Specifically, the gate electrode 1221, the gate electrode 1141, and the first electrode 1111 may be formed in such a manner that a conductive layer is formed of the aforementioned materials by sputtering and then processed into a desired shape. At this time, it is preferable to select a material having characteristics suitable for a gate electrode of the thin film transistor as well as characteristics suitable for an electrode of the antifuse. In this embodiment, a film in which a tantalum nitride layer and a tungsten layer are stacked in this order is formed for the gate electrode 1221, the gate electrode 1141, and the first electrode 1111.

Then, an impurity element is added to the semiconductor layer 1217 and the semiconductor layer 1137. Here, impurity elements imparting different conductivity types are added to the semiconductor layer 1217 and the semiconductor layer 1137. Specifically, an impurity element imparting p-type conductivity is added to the semiconductor layer 1217, and an impurity element imparting n-type conductivity is added to the semiconductor layer 1137.

As the impurity element imparting n-type conductivity, phosphorus (P), arsenic (As), or the like is used. As the impurity element imparting p-type conductivity, boron (B), aluminum (Al), gallium (Ga), or the like is used. Further, the impurity element may be added by ion implantation or ion doping.

An impurity element imparting n-type conductivity is added to the semiconductor layer 1217 and the semiconductor layer 1137. Here, an impurity element is added at a lower concentration than that added to form a source region or a drain region, whereby a low-concentration impurity region (also referred to as a lightly doped drain (LDD) region) is formed. With the gate electrode 1221 and the gate electrode 1141 used as masks, a pair of low-concentration impurity regions are formed in a self-aligned manner in each of the semiconductor layer 1217 and the semiconductor layer 1137, and a channel formation region 1211 and a channel formation region 1131 each are formed between the pair of low-concentration impurity regions. The low-concentration impurity regions formed here, to which an n-type impurity element has been added, are also referred to as n regions.

An impurity element imparting n-type conductivity is added to the semiconductor layer 1137. In the semiconductor layer 1137, a pair of high-concentration impurity regions 1135, a pair of low-concentration impurity regions 1133, and the channel formation region 1131 are formed. The high-concentration impurity regions 1135 serve as a source region or a drain region in the semiconductor layer 1137.

Specifically, a resist mask is formed so as not to add an impurity element to the semiconductor layer 1217. A resist mask is also formed so as not to add an impurity element to part of the semiconductor layer 1137. For example, a resist mask is formed so that the low-concentration impurity region remains in the semiconductor layer 1137 and an impurity element is added to parts of the semiconductor layer 1137 which serve as a source region or a drain region. The resist mask is removed as appropriate after use.

An impurity element imparting p-type conductivity is added to the semiconductor layer 1217. Here, an impurity element is added at a lower concentration than that added to form a source region or a drain region, whereby a low-concentration impurity region (also referred to as a $p^-$ region) is formed. With the gate electrode 1221 used as a mask, a pair of low-concentration impurity regions are formed in a self-aligned manner. Note that a resist mask is formed so as not to add an impurity element to the semiconductor layer 1137. The resist mask is removed as appropriate after use.

An impurity element imparting p-type conductivity is added to the semiconductor layer 1217. In the semiconductor layer 1217, a pair of high-concentration impurity regions 1215, a pair of low-concentration impurity regions 1213, and the channel formation region 1211 are formed.

Specifically, a resist mask is formed so as not to add an impurity element to the semiconductor layer 1137. A resist mask is also formed so as not to add an impurity element to part of the semiconductor layer 1217. For example, a resist mask is formed so that the low-concentration impurity region remains in the semiconductor layer 1217 and an impurity element is added to parts of the semiconductor layer 1217 which serve as a source region or a drain region. The resist mask is removed as appropriate after use.

Although an impurity element imparting n-type conductivity is added in advance here, there is no particular limitation on the addition order of impurity elements. Further, the low-concentration impurity regions (LDD regions) are not necessarily formed.

In the example shown here, the low-concentration impurity regions serving as LDD regions are formed. The low-concentration impurity regions make it possible to reduce an electric field near a drain region and to prevent deterioration due to hot carrier injection. Note that the low-concentration impurity regions are not necessarily formed. Further, instead of a resist mask, a sidewall insulating layer may be formed on a side surface of a gate electrode and a low-concentration impurity region may be formed by using the sidewall insulating layer as a mask.

Next, an insulating layer 1512, an insulating layer 1514, and an insulating layer 1516 are formed to cover the gate electrode 1221, the gate electrode 1141, and the first electrode 1111. The insulating layer 1512, the insulating layer 1514, and the insulating layer 1516 are formed by sputtering, CVD, or the like using an inorganic insulating material such as silicon oxide, silicon nitride, silicon oxynitride, or silicon nitride oxide. Note that the insulating layer 1512, the insulating layer 1514, and the insulating layer 1516 may each have a single-layer structure or a stacked-layer structure. The insulating layer 1512, the insulating layer 1514, and the insulating layer 1516 also serve as a sidewall with which adjacent antifuses are insulated from each other.

The insulating layer 1512, the insulating layer 1514, and the insulating layer 1516 may be formed of a siloxane resin having high heat resistance which can be formed by coating. Note that the siloxane resin corresponds to a resin including a Si—O—Si bond. A skeleton structure of siloxane includes the bond of silicon (Si) and oxygen (O), in which an organic group (e.g., an alkyl group or an aryl group) or a fluoro group may be used as a substituent. The organic group may have a fluoro group.

When heat treatment is performed after silicon oxynitride layers are stacked as the insulating layer 1512 and the insulating layer 1514, the impurity elements added to the semiconductor layer 1217 and the semiconductor layer 1137 can be activated and the semiconductor layer 1217 and the semiconductor layer 1137 can be hydrogenated. The activation of the impurity elements and the hydrogenation of the semiconductor layers are performed by laser beam irradiation, heat treatment using an annealing furnace or RTA, or the like. Therefore, the gate electrode 1221, the gate electrode 1141, and the first electrode 1111 are formed of a material which can withstand a heat treatment temperature for the activation of the impurity elements and the hydrogenation of the semiconductor layers. In this embodiment, a film in which a tantalum nitride layer and a tungsten layer are stacked in this order is formed for the gate electrode 1221, the gate electrode 1141, and the first electrode 1111. Tungsten and tantalum nitride each are a high-melting-point metal, and thus can sufficiently withstand a treatment temperature for the activation and the hydrogenation.

The insulating layer 1516, the insulating layer 1514, the insulating layer 1512, and the gate insulating layer 1510 are selectively etched to form openings. In the etching, a region where an opening will not be formed may be covered with a resist mask. The etching may be performed by a dry etching method or a wet etching method, or may be performed by combining these etching methods. After the etching, the resist mask which is no longer needed is removed. The openings formed here are: openings reaching the high-concentration impurity regions 1215 formed in the semiconductor layer 1217; openings reaching the high-concentration impurity regions 1135 formed in the semiconductor layer 1137; and openings reaching the first electrode 1111. The openings reaching the first electrode 1111 are a first opening where a resistance material layer 1113 and a second electrode of the antifuse are formed later, and a second opening where a wiring electrically connected to the first electrode 1111 is formed later. Also, openings reaching the gate electrode 1221 and the gate electrode 1141 are formed. The first opening reaching the first electrode 1111, which is formed in this etching step, has a bottom surface diameter of about 1 μm to 6 μm. However, the first opening is preferably small because current consumption increases with an increase in the diameter of the first opening. Although the size of the opening is indicated by a diameter, the shape of a top surface of the opening is not limited to a round, and may be an ellipse or a rectangle.

The openings reaching the semiconductor layers, the openings reaching the gate electrodes, and the openings reaching the first electrode can be formed in one etching step by controlling etching conditions as appropriate.

The resistance material layer 1113 is formed to cover the first opening reaching the first electrode 1111. The resistance material layer 1113 has a stacked-layer structure in which an amorphous silicon layer is stacked over a silicon oxynitride layer. The silicon oxynitride layer is formed by CVD, sputtering, or the like to a thickness of 1 nm to 20 nm, preferably 1 nm to 15 nm. The amorphous silicon layer is formed by CVD, sputtering, or the like to a thickness of 1 nm to 200 nm, preferably 5 nm to 100 nm. For example, a silicon oxynitride layer with a thickness of 6 nm and an amorphous silicon layer with a thickness of 15 nm are stacked as the resistance material layer 1113. The resistance material layer 1113 may have a single-layer structure or a stacked-layer structure as long as the resistance of the layer is changed from a high resistance to a low resistance by application of an electric signal. The resistance material layer 1113 may be formed by forming a resistance material layer by the aforementioned CVD or sputtering, and then selectively etching the layer to cover the first opening.

After a conductive layer is formed by sputtering on the entire surface of the substrate, the conductive layer is selectively etched to form a pair of conductive layers 1223, a conductive layer 1225, a pair of conductive layers 1143, and a conductive layer 1145.

The pair of conductive layers 1223 serve as a source electrode or a drain electrode of the transistor 1210. The conductive layer 1225 serves as a leading wiring of the gate electrode 1221 of the transistor 1210. The pair of conductive layers 1143 serve as a source electrode or a drain electrode of the transistor 1130. The conductive layer 1145 serves as a leading wiring of the gate electrode 1141 of the transistor 1130.

A second electrode 1115 serving as the other electrode of the antifuse formed as the memory element 1110, and a third electrode 1117 electrically connected to the first electrode 1111, are formed by processing the same layer in the same process as the conductive layers 1223 and the like. The third electrode 1117 can serve as a leading wiring electrically connected to the first electrode 1111.

One of the pair of conductive layers 1143 and the second electrode 1115 are shown as a continuous conductive layer, for example. The antifuse which is the memory element 1110 and the transistor 1130 are electrically connected to each other through the second electrode 1115.

The conductive layer used for forming the conductive layers 1223, the conductive layer 1225, the conductive layers 1143, the conductive layer 1145, the second electrode 1115, and the third electrode 1117 can be made of a material selected from the aforementioned materials of the gate electrode.

The conductive layer and the electrode such as the conductive layer 1223 and the second electrode 1115 are formed using, for example, a three-layer structure in which a titanium layer with a thickness of 50 nm to 200 nm (e.g., 100 nm), an aluminum layer with a thickness of 100 nm to 400 nm (e.g., 300 nm), and a titanium layer with a thickness of 50 nm to 200 nm (e.g., 100 nm) are stacked in this order. A titanium layer formed as a surface layer of the conductive layer and the electrode such as the conductive layer 1223 and the second electrode 1115 allows a reduction in the contact resistance with other layers. Further, an aluminum layer used for the conductive layer and the electrode such as the conductive layer 1223 and the second electrode 1115 makes it possible to reduce the wiring resistance.

Through the above steps, the memory element 1110 and the transistor 1130 can be formed in the memory portion 1100, and the transistor 1210 can be formed in the other circuit portion 1200. In addition, a resistor, a capacitor, or the like may be formed as appropriate.

In the memory portion 1100, the antifuse is formed as the memory element 1110. In the antifuse, a stacked structure of a silicon oxynitride layer and an amorphous silicon layer is interposed as the resistance material layer 1113 between a pair of electrodes: the first electrode 1111 formed in the same step as the gate electrode of the transistor; and the second electrode 1115 formed in the same step as the conductive layers which serve as the source electrode or drain electrode of the transistor.

An insulating layer 1520, an insulating layer 1522, and an insulating layer 1524 are formed on a surface of the insulating layer 1516 on which the conductive layers 1223 and the like are provided. The insulating layer 1520, the insulating layer 1522, and the insulating layer 1524 may be formed of a single layer or stacked layers using an inorganic insulating material, an organic insulating material, or a combination thereof. It is preferable that an inorganic insulating layer serving as a passivation film and an organic insulating layer serving as a planarization film be stacked in this order on the surface of the insulating layer 1516 on which the conductive layers 1223 and the like are provided. For example, the insulating layer 1520 is made of an inorganic insulating material, and the insulating layers 1522 and 1524 are made of an organic insulating material. The stacked structure of the inorganic insulating layer and the organic insulating layer contributes to sufficient planarization while preventing entry of moisture into the element.

Separation is performed at the interface of the separation layer 1504 (at the interface between the separation layer 1504 and the insulating layer 1502 or the interface between the separation layer 1504 and the insulating layer 1506), or in the separation layer 1504. By the separation along the separation layer 1504, an element layer 1600 over the separation layer 1504 is separated from the supporting substrate 1500.

Here, methods for separating the element layer 1600 are listed below: (1) a method in which a stacked structure of a metal layer and a layer containing a metal oxide (or a metal nitride) is provided as the separation layer 1504 between the supporting substrate 1500 and the element layer 1600, and the layer containing a metal oxide is weakened by crystallization, so that the element layer 1600 is physically separated from the supporting substrate 1500; (2) a method in which a stacked structure of a metal layer and a layer containing a metal oxide (or a metal nitride) is provided as the separation layer 1504 between the supporting substrate 1500 and the element layer 1600, the layer containing a metal oxide is weakened by crystallization, and part of the separation layer 1504 is etched away using a liquid etchant, $NF_3$, or a halogen fluoride gas such as $BrF_3$, or $ClF_3$, so that the element layer 1600 is physically separated from the supporting substrate 1500; (3) a method in which the separation layer 1504 is formed of amorphous silicon containing hydrogen between the supporting substrate 1500 and the element layer 1600, and the separation layer 1504 is irradiated with a laser beam to discharge a hydrogen gas, so that the supporting substrate 1500 is separated from the element layer 1600; (4) a method in which the separation layer 1504 is formed of amorphous silicon between the supporting substrate 1500 and the element layer 1600, and the separation layer 1504 is etched away using a liquid etchant or a halogen fluoride gas to cause separation; (5) a method in which the supporting substrate 1500 provided with the element layer 1600 is mechanically shaved, or the supporting substrate 1500 is etched away using a liquid etchant or a halogen fluoride gas to cause separation; (6) a method in which an opening reaching the separation layer 1504 is formed by laser beam irradiation in a position of the element layer 1600 where the thin film transistors, the antifuse, the antenna, and the like are not formed, and then the element layer 1600 is physically separated from the supporting substrate 1500 with the opening used as a trigger; (7) a method in which an opening reaching the separation layer 1504 is formed by laser beam irradiation in a position of the element layer 1600 where the thin film transistors, the antifuse, the antenna, and the like are not formed, and then water is poured into the opening, so that the element layer 1600 is physically separated from the supporting substrate 1500; and the like. In the above-described separation methods (1) and (2), as the metal oxide layer or the metal nitride layer, a metal oxide layer or a metal nitride layer can be used which is obtained in forming an insulating layer over a metal layer formed as the separation layer. Further, in the above-described separation method (6), after the opening reaching the separation layer 1504 is formed, part of the separation layer 1504 may be etched away using a liquid etchant or a halogen fluoride gas which is introduced through the opening, and then physical separation may be performed.

As illustrated in FIG. 6A, the element layer 1600 is sealed between a first substrate 1300 and a second substrate 1340. A substrate having flexibility is preferably used as the first substrate 1300 and the second substrate 1340, and for example, a plastic film, paper, thin ceramics, or a sheet in which a textile of a carbon fiber or a glass fiber is impregnated with a resin (also referred to as a prepreg), can be used. The first substrate 1300 and the second substrate 1340 can be bonded using an adhesive layer such as an epoxy resin layer. By using a flexible material for the first substrate 1300 and the second substrate 1340 between which the element layer 1600 is sealed, a semiconductor device completed can be attached as an RFID tag to a curved surface of an object or the like.

The order of separation and sealing of the element layer 1600 can be determined as appropriate by a practitioner, for example, (1) after the element layer 1600 is separated from the supporting substrate 1500, the second substrate 1340 is bonded to a surface of the element layer 1600 opposite to the separation surface, and the first substrate 1300 is bonded to the separation surface of the element layer 1600 (the surface from which the supporting substrate 1500 is separated), (2) after the second substrate 1340 is fixed to the surface of the element layer 1600 opposite to the surface on which the separation layer 1504 is provided, the element layer 1600 is separated from the supporting substrate 1500 and the first substrate 1300 is bonded to the separation surface of the element layer 1600, or (3) the layer which does not include an antenna is separated from the supporting substrate 1500 before the antenna is formed, then, the antenna is formed and the first substrate 1300 and the second substrate 1340 are bonded.

Through the above steps, the semiconductor device functioning as an RFID tag can be manufactured. Further, the method of bonding from the supporting substrate to another substrate using the separation layer is employed; as a result, a thin, lightweight, and shock-resistant RFID tag can be manufactured. Moreover, an RFID tag which is flexible and capable of being attached to a curved surface or the like can be manufactured.

Note that the semiconductor device (the RFID tag) is provided with an antenna as appropriate. There is no particular limitation on the shape of an antenna applicable to the semiconductor device of this embodiment.

Figure 7A:
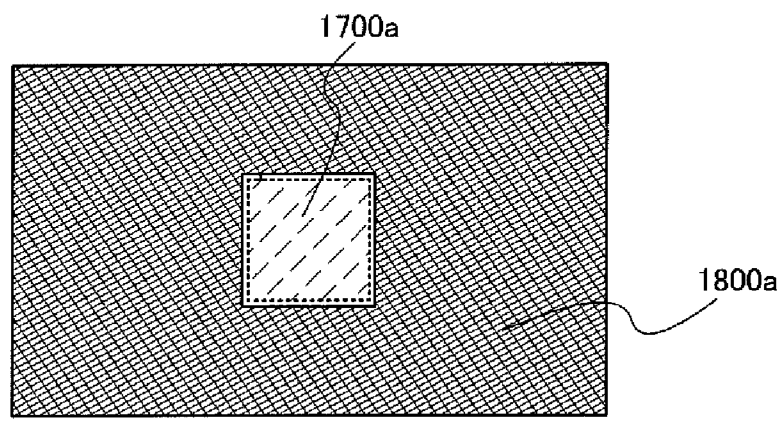
FIGS. 7A to 7E are schematic views each illustrating a semiconductor device of one embodiment of the present invention.
Figure 7B:
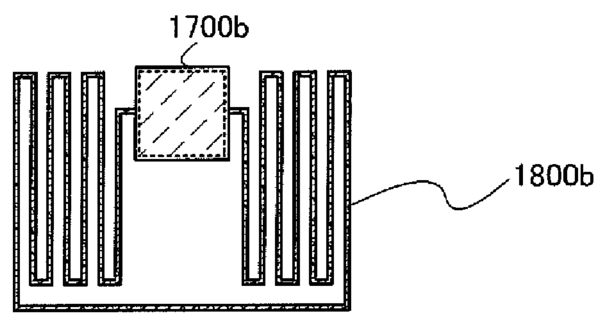
Figure 7C:
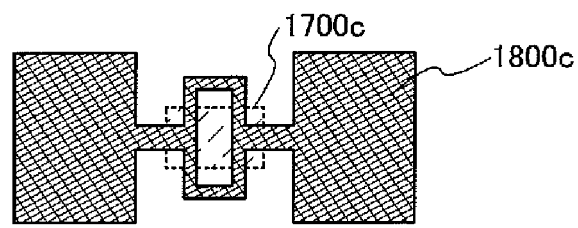
Figure 7D:
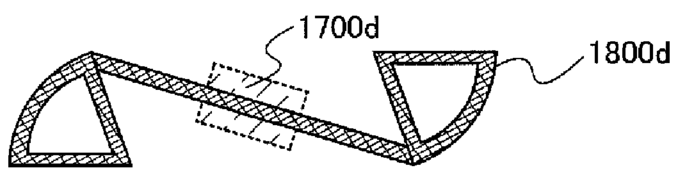
Figure 7E:
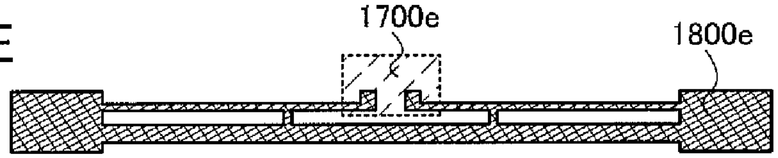
Figure 8A:
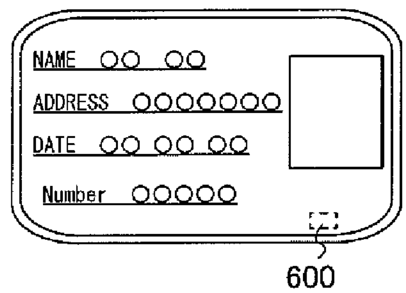
FIGS. 8A to 8G are views illustrating application examples of a semiconductor device of one embodiment of the present invention.
Figure 8B:
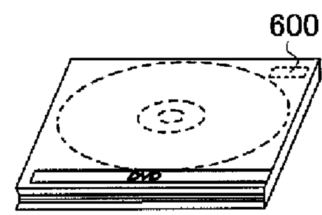
Figure 8C:
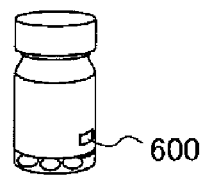
Figure 8D:
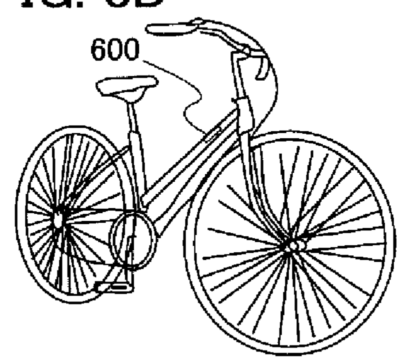
Figure 8E:
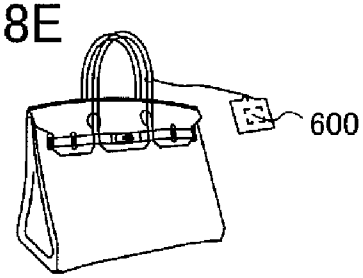
Figure 8F:
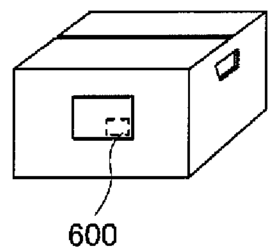
Figure 8G:
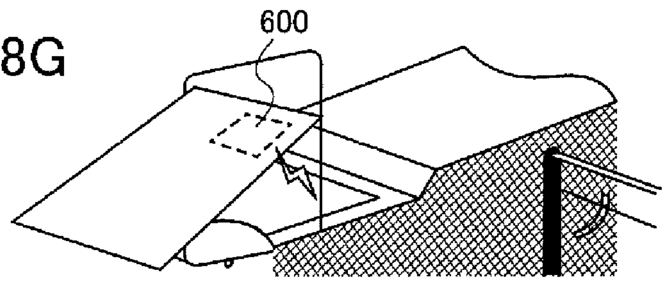

For example, as illustrated in FIG. 7A, a planar antenna 1800*a* may be provided around a circuit portion 1700*a*. As illustrated in FIG. 7B, a thin antenna 1800*b* may be provided to surround a circuit portion 1700*b*. A circuit portion 1700*c* may be provided with an antenna 1800*c* for receiving a high-frequency electromagnetic wave as illustrated in FIG. 7C. Also, as illustrated in FIG. 7D, a circuit portion 1700*d* may be provided with an antenna 1800*d* which is 180° omni-directional (capable of receiving signals from any direction). Further, a circuit portion 1700*e* may be provided with an antenna 1800*e* like a stick extended long as illustrated in FIG. 7E. Note that the circuit portions 1700*a* to 1700*e* each include the other circuit portion 1200 and the memory portion 1100 illustrated in FIG. 6A. The circuit portions 1700*a* to 1700*e* also correspond to the circuit portion illustrated in FIG. 4 and FIG. 5, which includes various circuits other than the antenna portion.

As a method for supplying power to the semiconductor device of this embodiment, an electromagnetic coupling method, an electromagnetic induction method, an electromagnetic wave method, or the like can be employed. The power supplying method may be selected as appropriate by a practitioner in consideration of an application, and an antenna having an optimal length and shape may be provided depending on the power supplying method.

In the case of employing, for example, an electromagnetic coupling method or an electromagnetic induction method (e.g., a 13.56 MHz band) as the power supplying method, a conductive layer in an annular shape or a spiral shape (e.g., a coil, a spiral antenna, or a loop antenna) can be used as an antenna. An antenna may be formed directly over a substrate including a circuit portion, or an external antenna may be connected. In particular, when an antenna is directly formed over a substrate including a circuit portion, the antenna terminal and the circuit portion can be bonded to each other with high reliability, whereby a robust tag can be manufactured.

In addition, the RFID tag of this embodiment consumes less power because data is processed by a plurality of transmission methods in the memory portion. Accordingly, the antenna employing an electromagnetic coupling method or an electromagnetic induction method can be reduced in size, resulting in a reduction in the size, weight, and cost of the RFID tag.

In the case of employing an electromagnetic wave method (e.g., a UHF band (in the range of from 860 MHz to 960 MHz), or a 2.45 GHz band) as the power supplying method, a conductive layer in a linear shape (e.g., a dipole antenna), or in a flat shape (e.g., a patch antenna) can be used as an antenna. The shape of the conductive layer is not limited to a linear shape but may be a curved shape, a meandering shape, or a combination thereof. In the case where an antenna has a large size, an external antenna is connected although the antenna can also be formed directly over the substrate.

The shape and length of the antenna may be determined as appropriate in consideration of a wavelength of an electromagnetic wave. For example, when a frequency of 2.45 GHz is used, a half-wave dipole antenna may have a length of about 60 mm (a half wavelength), and a monopole antenna may have a length of about 30 mm (a quarter wavelength).

Note that the structure shown in this embodiment can be combined as appropriate with any of the structures of the other embodiments in this specification.

Embodiment 5

In this embodiment, a method for manufacturing a semiconductor device having a wireless communication function, which is different from the method shown above in Embodiment 3, will be described. Note that the same elements as in FIGS. 6A and 6B and elements having a common function to those in FIGS. 6A and 6B are denoted by the same reference numerals for explanation, and repetitive description is omitted or simplified. Hereinafter, the method for manufacturing a semiconductor device in which the memory portion 1100 and the other circuit portion 1200 are provided over the same substrate, will be described with reference to FIGS. 9A to 9D and FIGS. 10A to 10C.

Figure 9A:
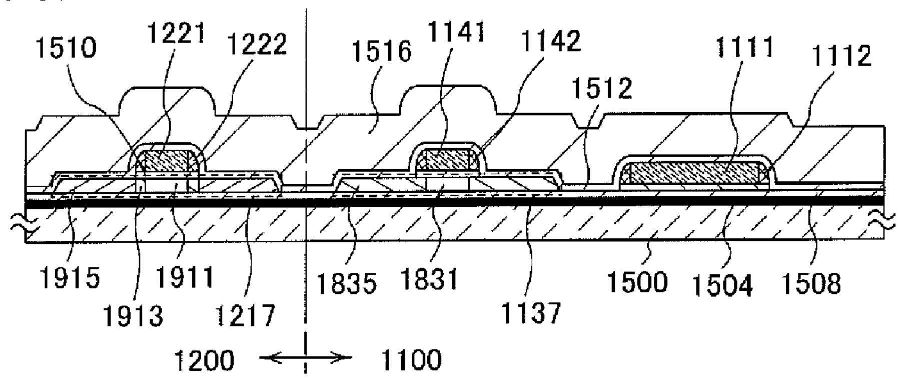
FIGS. 9A to 9D are schematic cross-sectional views illustrating a method for manufacturing a semiconductor device of one embodiment of the present invention.

As illustrated in FIG. 9A, the separation layer 1504 and the insulating layer 1508 are stacked in this order over the supporting substrate 1500. Note that an insulating layer or the like may be provided between the supporting substrate 1500 and the separation layer 1504, and between the separation layer 1504 and the insulating layer 1508.

The semiconductor layer 1217 and the semiconductor layer 1137 are formed over the insulating layer 1508. The gate insulating layer 1510 is formed over the semiconductor layer 1217 and the semiconductor layer 1137.

The gate electrode 1221 which overlaps the semiconductor layer 1217 with the gate insulating layer interposed therebetween, and the gate electrode 1141 which overlaps the semiconductor layer 1137 with the gate insulating layer interposed therebetween, are formed. Further, the first electrode 1111 serving as one electrode of an antifuse is formed by processing the same layer in the same process as the gate electrode 1221 and the gate electrode 1141.

An impurity element is added to the semiconductor layer 1217 and the semiconductor layer 1137. An impurity element imparting different conductivity types is added to the semiconductor layer 1217 and the semiconductor layer 1137: in this embodiment, an impurity element imparting n-type conductivity is added to the semiconductor layer 1217; and an impurity element imparting p-type conductivity is added to the semiconductor layer 1137.

An impurity element imparting n-type conductivity is added to the semiconductor layer 1217 so as to form a low-concentration impurity region. With the gate electrode 1221 used as a mask, a pair of low-concentration impurity regions are formed in a self-aligned manner in the semiconductor layer 1217, and a channel formation region 1911 is formed between the pair of low-concentration impurity regions. Note that a resist mask is formed so as not to add an impurity element to the semiconductor layer 1137. The resist mask is removed as appropriate after use.

Next, an impurity element imparting p-type conductivity is added to the semiconductor layer 1137 so as to form a source region or a drain region. With the gate electrode 1141 used as a mask, a pair of high-concentration impurity regions 1835 are formed in a self-aligned manner in the semiconductor layer 1137, and a channel formation region 1831 is formed between the pair of high-concentration impurity regions 1835. Note that a resist mask is formed so as not to add an impurity element to the semiconductor layer 1217. The resist mask is removed as appropriate after use.

Next, a sidewall insulating layer 1222, a sidewall insulating layer 1142, and a sidewall insulating layer 1112 are formed on the side of the gate electrode 1221, on the side of the gate electrode 1141, and on the side of the first electrode 1111, respectively.

An example of a method for manufacturing the sidewall insulating layer 1222, the sidewall insulating layer 1142, and the sidewall insulating layer 1112 is described. An insulating layer is formed to cover the gate insulating layer 1510, the gate electrode 1221, the gate electrode 1141, and the first electrode 1111. The insulating layer is formed by, for example, plasma CVD or sputtering using a single-layer film or a stacked-layer film of an inorganic insulating material or an organic insulating material. Next, the insulating layer is selectively etched by anisotropic etching mainly in a perpendicular direction, whereby insulating layers (the sidewall insulating layer 1222, the sidewall insulating layer 1142, and the sidewall insulating layer 1112) are formed on the sides of the gate electrode 1221, the gate electrode 1141, and the first electrode 1111. Note that part of the gate insulating layer 1510 can be etched at the same time as the formation of the sidewall insulating layer 1222, the sidewall insulating layer 1142, and the sidewall insulating layer 1112. FIG. 9A illustrates an example in which the gate insulating layer 1510 is etched so as to be aligned with the side surfaces of the sidewall insulating layer 1222, the sidewall insulating layer 1142, and the sidewall insulating layer 1112. The gate insulating layer 1510 remains under the gate electrode 1221 and the sidewall insulating layer 1222, under the gate electrode 1141 and the sidewall insulating layer 1142, and under the first electrode 1111 and the sidewall insulating layer 1112.

Next, an impurity element imparting n-type conductivity is added to the semiconductor layer 1217. Here, an impurity element is added to the semiconductor layer 1217 so as to form a source region or a drain region. With the gate electrode 1221 and the sidewall insulating layer 1222 used as a mask, a pair of high-concentration impurity regions 1915 and a pair of low-concentration impurity regions 1913 are formed in a self-aligned manner in the semiconductor layer 1217. The pair of low-concentration impurity regions 1913 are formed in a region which substantially overlaps the sidewall insulating layer 1222 with the gate insulating layer 1510 interposed therebetween. Note that a resist mask is formed so that an impurity element is not added to the semiconductor layer 1137. The resist mask is removed as appropriate after use.

In this embodiment, an n-channel transistor is manufactured in the other circuit portion 1200 and a p-channel transistor is manufactured in the memory portion 1100; however, the present invention is not limited to this example. Further, although each circuit portion includes one transistor in FIGS. 9A to 9D for convenience, the number of transistors is not limited to one. Moreover, although FIGS. 9A to 9D illustrate the example in which the low-concentration impurity regions 1913 are provided in the semiconductor layer 1217, low-concentration impurity regions can also be formed in the semiconductor layer 1137 with use of a sidewall insulating layer.

An insulating layer is formed to cover the gate electrode 1221, the gate electrode 1141, and the first electrode 1111, and the sidewall insulating layer 1222, the sidewall insulating layer 1142, and the sidewall insulating layer 1112 which are formed on the sides of the respective electrodes. In this embodiment, as the insulating layer, an insulating layer 1512 and an insulating layer 1516 are stacked in this order.

A cross-sectional view of the semiconductor device obtained through the above steps corresponds to FIG. 9A.

A first opening 1830 reaching the first electrode 1111 is formed. For example, a resist mask is formed over the insulating layer 1516 and the insulating layer 1516 and the insulating layer 1512 are selectively etched, so that the first opening 1830 reaching the first electrode 1111 is formed. The first opening 1830 has a diameter, for example, of about 1 μm to 6 μm. The resist mask is removed as appropriate after use.

Figure 9B:
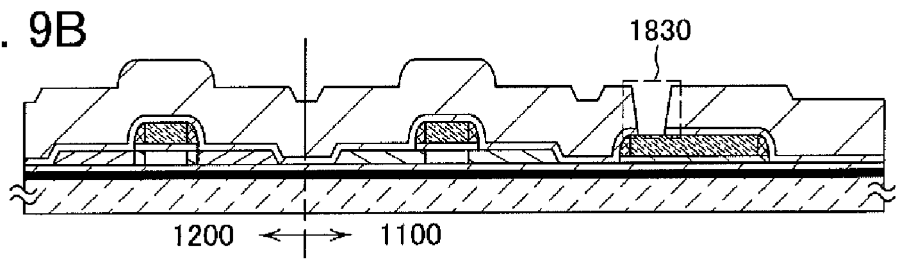
Figure 9C:
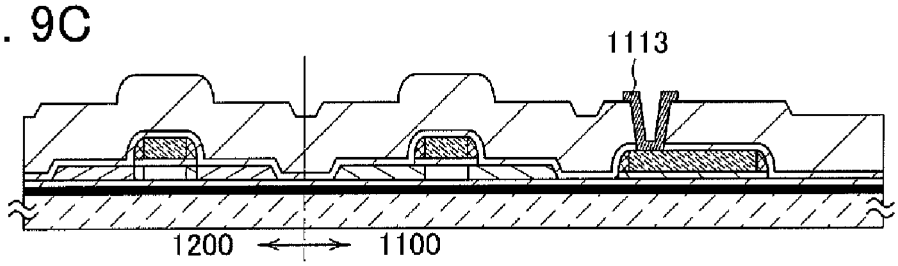
Figure 9D:
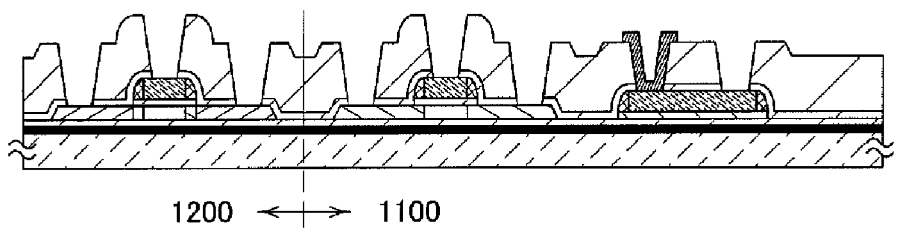

A cross-sectional view of the semiconductor device obtained through the above steps corresponds to FIG. 9B.

The resistance material layer 1113 touching the first electrode 1111 is formed to cover the first opening 1830. A cross-sectional view of the semiconductor device obtained through the above steps corresponds to FIG. 9C.

Second openings are formed to reach the high-concentration impurity regions 1915 formed in the semiconductor layer 1217, the gate electrode 1221, the high-concentration impurity regions 1835 formed in the semiconductor layer 1137, and the gate electrode 1141. For example, a resist mask is formed over the insulating layer 1516 and the insulating layer 1516 and the insulating layer 1512 are selectively etched, so that the second openings are formed. The resist mask is removed as appropriate after use. A cross-sectional view of the semiconductor device obtained through the above steps corresponds to FIG. 9D.

The pair of conductive layers 1223, the conductive layer 1225, the pair of conductive layers 1143, and the conductive layer 1145 are formed in the second openings. The pair of conductive layers 1223 are electrically connected to the high-concentration impurity regions 1915, and the pair of conductive layers 1143 are electrically connected to the high-concentration impurity regions 1835. The pair of conductive layers 1223 and the pair of conductive layers 1143 serve as a source electrode or a drain electrode. The conductive layer 1225 serves as a leading wiring of the gate electrode 1221, and the conductive layer 1145 serves as a leading wiring of the gate electrode 1141.

The second electrode 1115 serving as the other electrode of the antifuse is formed over the resistance material layer 1113, and the third electrode 1117 is formed to be electrically connected to the first electrode 1111.

Figure 10A:
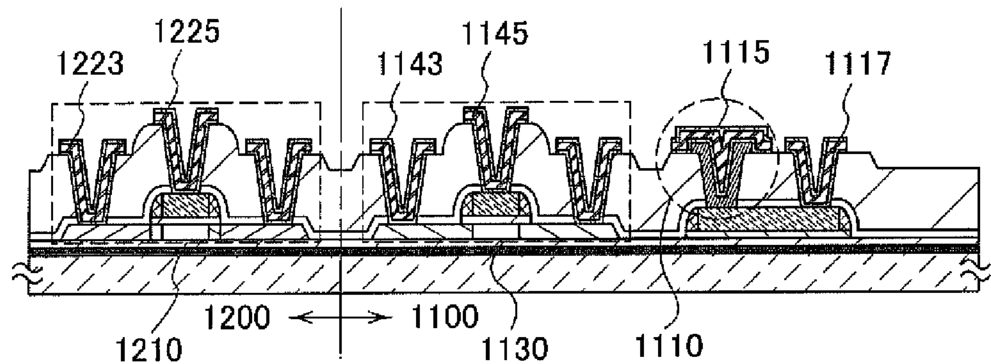
FIGS. 10A to 10C are schematic cross-sectional views illustrating a method for manufacturing a semiconductor device of one embodiment of the present invention.

A cross-sectional view of the semiconductor device obtained through the above steps corresponds to FIG. 10A. In this embodiment, the memory element 1110 and the p-channel transistor 1130 are manufactured in the memory portion 1100, and the n-channel transistor 1210 is manufactured in the other circuit portion 1200.

An insulating layer is formed over the insulating layer 1516 provided with the conductive layers 1223, the second electrode 1115, and the like. The insulating layer is preferably formed by combining an inorganic insulating layer and an organic insulating layer as appropriate. In order to increase the reliability of the semiconductor device having a wireless communication function, an inorganic insulating layer is preferably formed. In the case where an antenna is formed by a printing method (e.g., screen printing or droplet discharging) in a later step, the insulating layer preferably has planarity and an organic insulating layer is preferably formed. In this embodiment, the insulating layer 1522 having planarity is formed for example. The insulating layer 1522 can also serve as an interlayer insulating layer for electrically insulating an antenna from the element such as the transistor or the memory element.

Figure 10B:
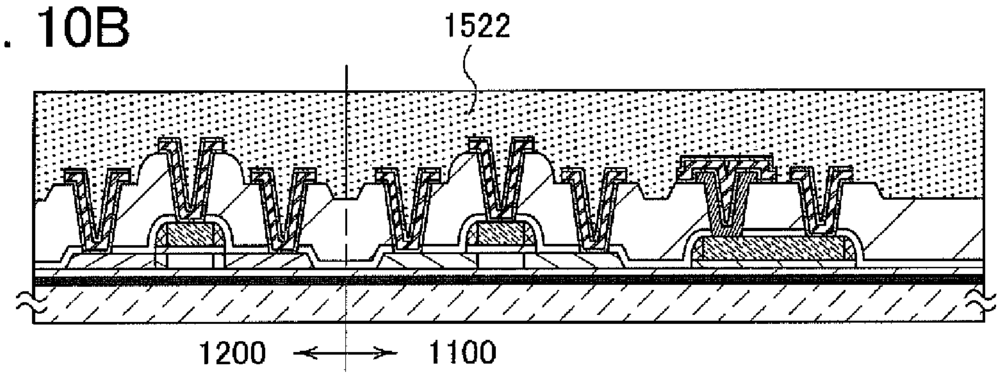

A cross-sectional view of the semiconductor device obtained through the above steps corresponds to FIG. 10B.

Next, an antenna 1801 is formed over the insulating layer 1522. Here, a built-in antenna 1801 is provided in the semiconductor device, for example. There is no particular limitation on the shape of the antenna 1801, for example, a linear antenna (a loop antenna, a dipole antenna, a spiral antenna, or the like), or a flat antenna (a patch antenna or the like) can be formed.

For example, the antenna 1801 can be formed in the following manner: a metal layer of aluminum, silver, or the like is formed by sputtering and then selectively etched to a desired shape. The antenna 1801 can also be formed by screen printing, droplet discharging, or the like.

Next, an insulating layer is formed over the insulating layer 1522 provided with the antenna 1801. The insulating layer is preferably formed by combining an inorganic insulating layer and an organic insulating layer as appropriate. For example, an insulating layer 1523 is formed of an inorganic insulating material, and an insulating layer 1524 having a planar surface is formed of an organic insulating material.

Figure 10C:
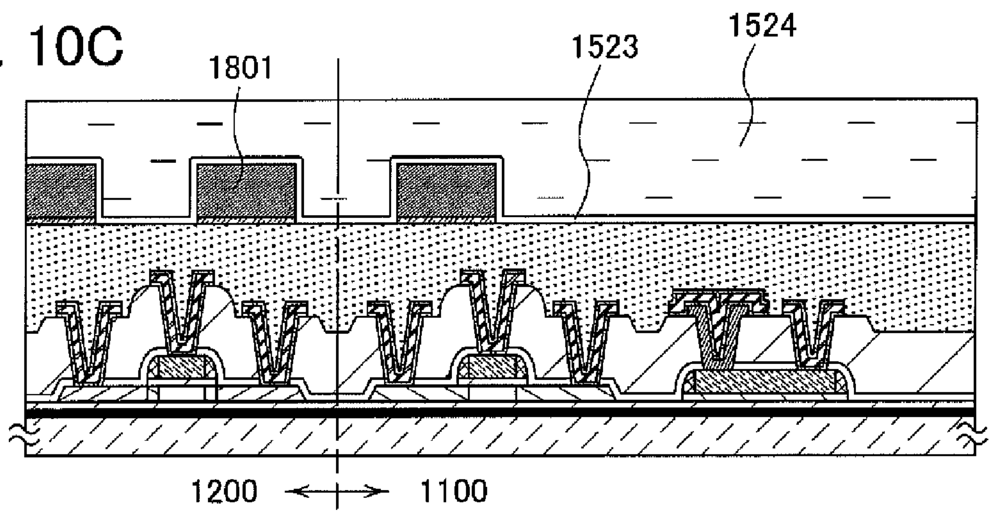

A cross-sectional view of the semiconductor device obtained through the above steps corresponds to FIG. 10C.

Separation is performed at the interface of the separation layer 1504 (at the interface between the separation layer 1504 and the supporting substrate 1500 or the interface between the separation layer 1504 and the insulating layer 1508), or in the separation layer 1504. By the separation along the separation layer 1504, an element layer over the separation layer 1504 is separated from the supporting substrate 1500.

The element layer separated from the supporting substrate 1500 is sealed with a flexible substrate (sheet) or the like, whereby a semiconductor device (an RFID tag) having a wireless communication function is obtained.

The semiconductor device of this embodiment consumes less power because data is processed by a plurality of transmission methods in the memory portion. Accordingly, the antenna employing an electromagnetic coupling method or an electromagnetic induction method can be reduced in size, resulting in a reduction in the size, weight, and cost of the RFID tag.

Note that the structure shown in this embodiment can be combined as appropriate with any of the structures of the other embodiments in this specification.

Embodiment 6

In this embodiment, application examples of a semiconductor device (an RFID tag) of one embodiment of the present invention will be described with reference to FIGS. 8A to 8G. Here, FIGS. 8A to 8G are schematic views illustrating application examples of the semiconductor device.

The application range of the semiconductor device (the RFID tag) is wide. The semiconductor device (the RFID tag) can be used to be mounted on, for example, bills, coins, securities, bearer bonds, certificates (e.g., driver's licenses or resident cards, see FIG. 8A), containers for wrapping objects (e.g., wrapping paper or bottles, see FIG. 8C), recording media (e.g., DVDs or video tapes, see FIG. 8B), vehicles (e.g., bicycles, see FIG. 8D), personal belongings (e.g., bags or glasses), foods, plants, animals, human bodies, clothes, commodities, or electronic devices (e.g., liquid crystal display devices, EL display devices, television sets, or mobile phones), shipping tags of objects (see FIGS. 8E and 8F), or commuter passes, carnets, or various tickets (see FIG. 8G).

A semiconductor device 600 is fixed to a product (an object itself or an object attached to the product) by being attached to a surface of the object, mounted on the object, or embedded in the object. For example, the semiconductor device is fixed to a product by being embedded in paper of a book or in an organic resin of a package. Since the semiconductor device 600 is reduced in size, thickness, and weight, the design of the product is not spoiled even after the semiconductor device is fixed to the product. In addition, when the semiconductor device 600 is mounted on bills, coins, securities, bearer bonds, certificates, or the like, an authentication function can be obtained, and forgery can be prevented by utilizing the authentication function. Further, when the semiconductor device 600 is attached to containers for wrapping objects, recording media, personal belongings, foods, clothes, commodities, electronic devices, or the like, a system such as an inspection system can be efficiently performed. Further, the semiconductor device 600 can be manufactured using elements such as a thin film transistor over a flexible substrate like a resin substrate at low cost; thus, it can be favorably used for disposable items such as carnets or a variety of thickets which are used only once or a small number of times. Furthermore, when the semiconductor device 600 is attached to the vehicles, the vehicles can have higher security against theft or the like.

The semiconductor device (the RFID tag) of this embodiment consumes less power and has an increased communication distance. Accordingly, the semiconductor device can be conveniently used for various applications because the communication distance has a high degree of flexibility. In addition, since a reduction in the size of an antenna can be achieved because of a reduction in the power consumption of the semiconductor device, the semiconductor device can be further reduced in size, so that a semiconductor device with improved convenience and design quality can be obtained.

Note that the structure shown in this embodiment can be combined as appropriate with any of the structures of the other embodiments in this specification.

This application is based on Japanese Patent Application serial no. 2009-232085 filed with Japan Patent Office on Oct. 6, 2009, the entire contents of which are hereby incorporated by reference.

What is claimed is:

1. A semiconductor device comprising:

a circuit portion;

a logic portion to which a demodulated signal is input from the circuit portion; and a memory portion connected to the logic portion through a plurality of signal lines, wherein the plurality of signal lines comprise reading signal lines and at least one writing signal line, wherein the number of the reading signal lines is greater than the number of the writing signal line, wherein the number of the reading signal lines is n (where n is an integer equal to or greater than 2), wherein the semiconductor device has a transfer rate of $\alpha$ bps, wherein the demodulated signal is decoded in the logic portion with use of a first clock frequency $K\alpha$ Hz (where K is an integer equal to or greater than 1), and wherein data stored in the memory portion is read through the reading signal lines with use of a second clock frequency $L\alpha/n$ Hz (where L is an integer satisfying $L/n<K$).

2. The semiconductor device according to claim 1, wherein data is written from the logic portion to the memory portion through the writing signal line with use of a third clock frequency.

3. The semiconductor device according to claim 1, wherein data read from the memory portion is converted in the logic portion and transmitted in serial to the circuit portion with use of the first clock frequency Kα Hz.

4. The semiconductor device according to claim 1, wherein the memory portion comprises a write-once memory element.

5. The semiconductor device according to claim 1, wherein the memory portion comprises an antifuse.

6. The semiconductor device according to claim 1, wherein the memory portion comprises a memory element having a floating gate or a memory element using a magnetic material.

7. The semiconductor device according to claim 1, wherein the semiconductor device comprises an RFID tag.

8. A semiconductor device comprising:

a circuit portion;

a logic portion to which a demodulated signal is input from the circuit portion; and a memory portion connected to the logic portion through a plurality of signal lines, wherein the plurality of signal lines comprise reading signal lines and at least one writing signal line, wherein the number of the reading signal lines is greater than the number of the writing signal line, wherein the number of the reading signal lines is n (where n is an integer equal to or greater than 2), wherein the semiconductor device has a transfer rate of α bps, wherein the demodulated signal is decoded in the logic portion with use of a first clock frequency Kα Hz (where K is an integer equal to or greater than 1), and wherein state information of a memory cell in the memory portion is read through the reading signal lines with use of a second clock frequency Lα/n Hz (where L is an integer satisfying L/n<K).

9. The semiconductor device according to claim 8, wherein data is written from the logic portion to the memory portion through the writing signal line with use of a third clock frequency.

10. The semiconductor device according to claim 8, wherein data read from the memory portion is converted in the logic portion and transmitted in serial to the circuit portion with use of the first clock frequency Kα Hz.

11. The semiconductor device according to claim 8, wherein the memory portion comprises a write-once memory element.

12. The semiconductor device according to claim 8, wherein the memory portion comprises an antifuse.

13. The semiconductor device according to claim 8, wherein the memory portion comprises a memory element having a floating gate or a memory element using a magnetic material.

14. The semiconductor device according to claim 8, wherein the semiconductor device comprises an RFID tag.

* * * * *